United States Patent
Chen et al.

(10) Patent No.: US 7,932,509 B2
(45) Date of Patent: Apr. 26, 2011

(54) PHASE CHANGE MEMORY ELEMENT

(75) Inventors: Wei-Su Chen, Hsinchu (TW); Chih-Wei Chen, Miaoli County (TW); Frederick T Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 196 days.

(21) Appl. No.: 12/205,635

(22) Filed: Sep. 5, 2008

(65) Prior Publication Data

US 2009/0127535 A1    May 21, 2009

(30) Foreign Application Priority Data

Nov. 16, 2007   (TW) ............................... 96143433 A

(51) Int. Cl.
*H01L 45/00*    (2006.01)
(52) U.S. Cl. .................................. 257/3; 257/E45.002
(58) Field of Classification Search ........ 257/3, E45.002
See application file for complete search history.

(56) References Cited

U.S. PATENT DOCUMENTS

| | | | |
|---|---|---|---|
| 6,927,410 B2 | 8/2005 | Chen | |
| 7,576,350 B2 * | 8/2009 | Lowrey et al. | 257/2 |
| 7,696,077 B2 * | 4/2010 | Liu | 438/597 |
| 7,732,801 B2 * | 6/2010 | Chen | 257/4 |
| 7,834,341 B2 * | 11/2010 | Wu et al. | 257/4 |
| 2006/0077706 A1 * | 4/2006 | Li et al. | 365/163 |
| 2006/0113520 A1 * | 6/2006 | Yamamoto et al. | 257/3 |
| 2007/0158698 A1 * | 7/2007 | Dennison et al. | 257/246 |

FOREIGN PATENT DOCUMENTS

CN       1992326 A      7/2007
* cited by examiner

*Primary Examiner* — Jerome Jackson, Jr.
*Assistant Examiner* — Paul A Budd

(57) ABSTRACT

A phase change memory device is disclosed, including a substrate. The phase change memory also includes a bottom electrode. A conductive structure with a cavity is provided to electrically contact the bottom electrode, wherein the conductive structure includes sidewalls with different thicknesses. A phase change spacer is formed to cross the sidewalls with different thicknesses. A top electrode is electrically contacted to the phase change spacer.

10 Claims, 29 Drawing Sheets

PHASE CHANGE MEMORY ELEMENT

CROSS REFERENCE TO RELATED APPLICATIONS

This application is based upon and claims the benefit of priority from the prior Taiwan Patent Application No. 096143433, filed on Nov. 16, 2007, the entire contents of which are incorporated herein by reference.

BACKGROUND OF THE INVENTION

1. Field of the Invention

The invention relates to a memory element and method for fabricating the same, and more particularly to a phase change memory element and method for fabricating the same.

2. Description of the Related Art

A phase change memory (PCM) device may potentially serve as a 64-megabyte (MB) or greater stand-alone non-volatile memory. Before PCM devices become a mainstream replacement for flash memory, however, they must first achieve excellent electrical and thermal performance. Fabrication of non-volatile memory with relatively higher device density using the conventional fabrication process is, thus, a major aim of researchers.

In general, two methods have been employed to increase the storage capability of a phase change memory. First, the amount of memory elements for a single phase change device is increased (i.e. integration increase). Second, multi-bit value in a single memory element is stored.

Since integration of a phase change element has been limited due to the resolution limit of the photolithography process, it is difficult to increase the integration of the phase change element without additional process complexity.

U.S. Pat. No. 6,927,410 B2 discloses a memory device 18 with discrete layers of phase change memory material to introduce multi-bit value into a single memory element. Referring to FIG. 1, the phase change element includes a bottom electrode 28, a top electrode 26, a plurality of phase change material layers 22 formed on the bottom electrode 28, and a plurality of dielectric layers 24, wherein the dielectric layer 24 is formed between each two adjacent phase change material layers 22 and is separated therefrom. Particularly, the plurality of phase change material layers 22 and the plurality of dielectric layers 24 include a multi-bit programmable structure 20. Referring to FIG. 2, the phase change material layers 22 have been crystallized to form different degrees of crystallization areas 30 by applying various electrical current paths (different pulse amounts or different maintaining time) via the bottom electrode 26 and 28, resulting in exhibition of different resistivities (the crystallization area has less resistivity than that of the amorphous area of the phase change material). Therefore, it is possible to program the phase change memory material with varying degrees of amorphousization/crystallization to produce varying degrees of resistivities, so that more than two possible bit values can be stored in a single memory cell (multi-bit storage).

Programming via crystallization can be performed using a plurality of discrete, shorter crystallizing thermal pulses (with the same or different energy) where the number of such pulses dictates the amount of memory material, and thus the number of phase change material layers, that are crystallized. The phase change material is crystallized in a piece-wise manner, layer by layer, until the desired number of layers is crystallized.

However, in order to fabricate the memory device 18 with multi-bit storage capacity, different strengths or different numbers of crystallizing thermal pulses should be provided, resulting in a necessity to form an additional controller to couple each memory element. Further, due to resistivity drift of the crystallized phase change material, faults may occur in the memory element during operation, thus resulting in lost stored data.

Moreover, there are many layers (such as a plurality of phase change material layers and a plurality of dielectric layers) alternately formed for fabricating the multi-bit memory element, thereby increasing the cost and process complexity and reducing production yield.

Therefore, it is necessary to develop a multi-bit phase change memory to solve the previously described problems.

BRIEF SUMMARY OF THE INVENTION

An exemplary embodiment of a phase change memory element includes a bottom electrode. A conductive structure with a cavity is formed, wherein the bottom part of the conductive structure is electrically contacted to the bottom electrode, wherein the conductive structure includes sidewalls with different thicknesses. A phase change spacer is formed, wherein the phase change spacer and the sidewalls with different thicknesses of the conductive structure are simultaneously intersected. And, a top electrode is formed, wherein the top electrode is electrically contacted to the phase change spacer.

An exemplary embodiment a method for forming the aforementioned phase change memory element includes providing a substrate, wherein a bottom electrode is formed on the substrate; forming a first isolation layer with a first opening on the substrate, and wherein the first opening exposes the top surface of the bottom electrode. A conductive layer is conformally formed on the substrate and the first opening, defining a second opening. A second isolation layer is blanketly formed on the substrate, filling the second opening and a part of the second isolation layer is removed within the second opening, resulting in the bottom surface and at least one sidewall of the conductive layer within the second opening being covered by the remaining second isolation layer. The conductive layer not covered by the remaining second isolation layer is trimmed, resulting in the conductive layer not covered by the remaining second isolation layer having a thickness differ from that of the conductive layer covered by the remaining second isolation layer. A third isolation layer is blanketly formed, and a planarization process is performed to form a conductive structure with a cavity including sidewalls with different thicknesses. A phase change spacer is formed, wherein the phase change spacer and the sidewalls with different thicknesses of the conductive structure are simultaneously intersected.

According to another embodiment of the invention, the phase change memory element includes a bottom electrode. A conductive structure with a cavity having sidewalls is formed, wherein the bottom part of the conductive structure is electrically contacted to the bottom electrode. A phase change spacer including a doped area and a non-doped area is formed, wherein the doped area and non-doped area of the phase change spacer respectively intersect the opposite sidewalls of the conductive structure. And, a top electrode is formed to be electrically contacted to the phase change spacer.

An exemplary embodiment a method for forming the aforementioned phase change memory element includes providing a substrate, wherein a bottom electrode is formed on the substrate. A conductive structure with a cavity is formed with sidewalls electrically contacted to the bottom electrode.

A phase change spacer is formed including a doped area and a non-doped area, wherein the doped area and non-doped area of the phase change spacer respectively intersect the opposite sidewalls of the conductive structure. A top electrode is formed electrically contacted to the phase change spacer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 3b, 4b, 5b, 6b, 7b, 8b, 9b, 10b, 11b, 12b, and 13b are cross sections along line A-A' respective of FIGS. 3a, 4a, 5a, 6a, 7a, 8a, 9a, 10a, 11a, 12a, and 13a.

FIGS. 4c, 5c, 6c, 7c, 8c, 9c, 10c, 11c, 12c, and 13c are cross sections along line B-B' respective of FIGS. 3a, 4a, 5a, 6a, 7a, 8a, 9a, 10a, 11a, 12a, and 13a.

FIG. 15b is a cross section along line B-B' of FIG. 15a.

FIGS. 16b and 17b are cross sections along line B-B' respective of FIGS. 16a and 17a.

FIG. 18b is a cross section along line A-A' respective of FIG. 18a.

FIG. 18c is a cross section along line B-B' respective of FIG. 18a.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
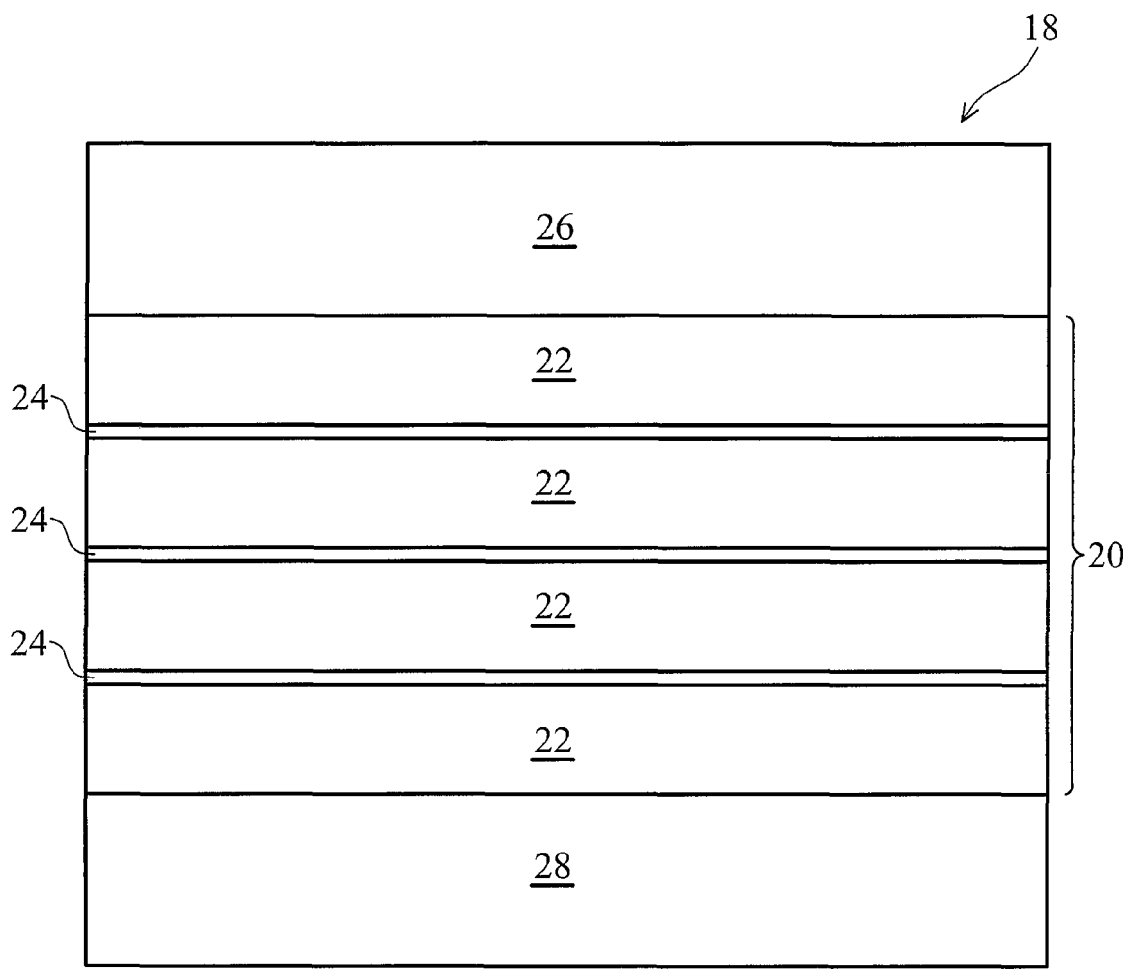
FIGS. 1 and 2 are cross sections of conventional phase change memory element.
Figure 2:
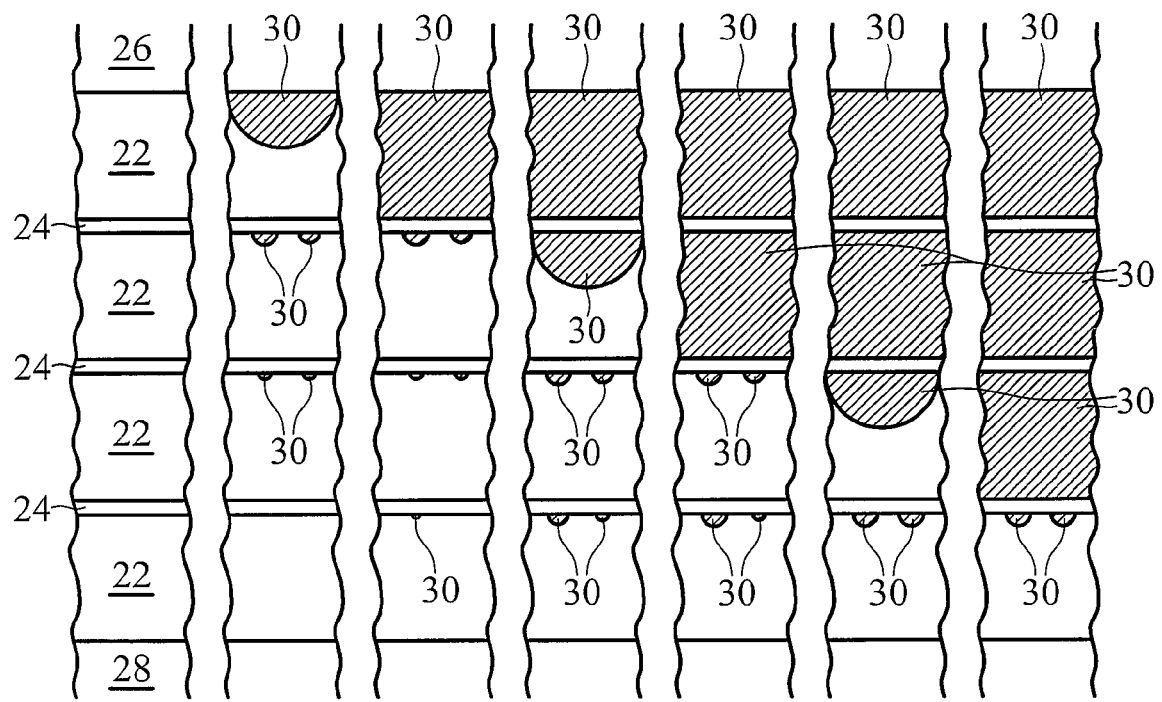
Figure 3A:
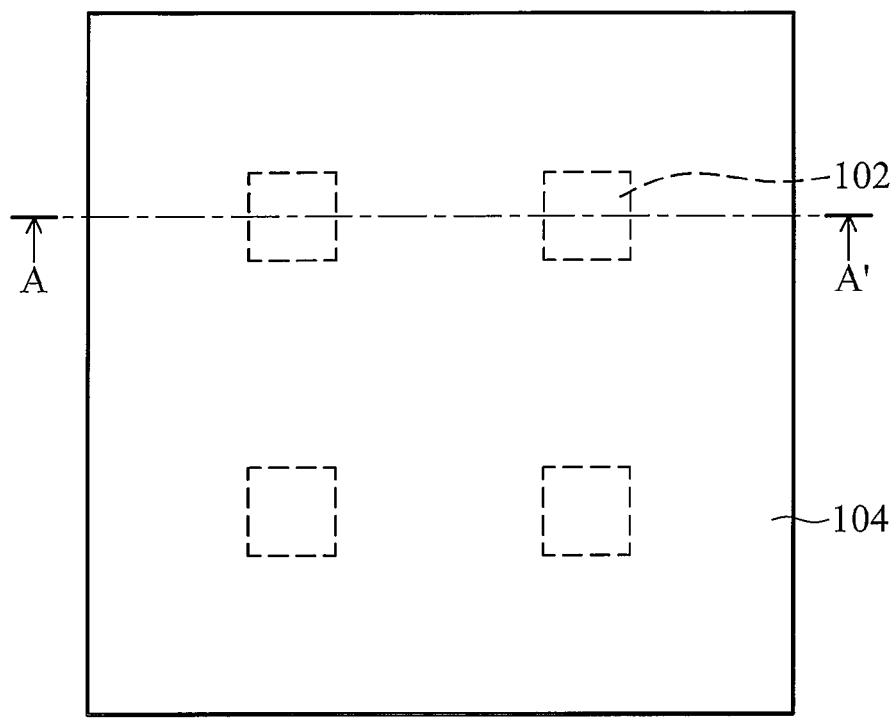
FIGS. 3a, 4a, 5a, 6a, 7a, 8a, 9a, 10a, 11a, 12a, and 13a are serial top views of a phase change memory element according to an embodiment of the invention.
Figure 3B:
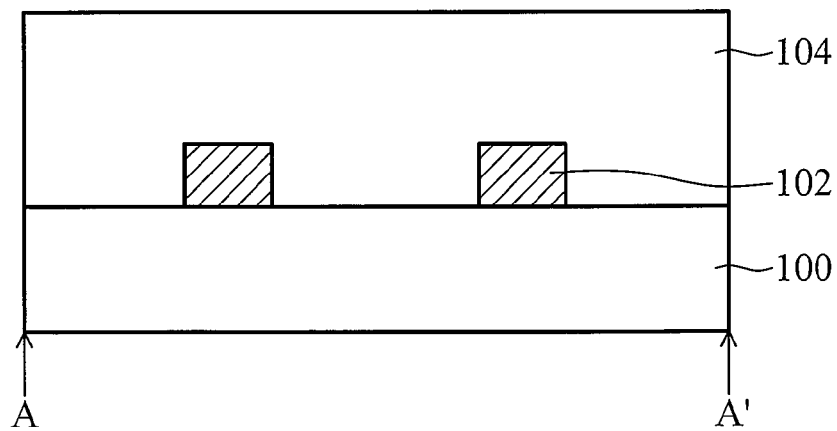

First, referring to FIG. 3a, a substrate 100 is provided. FIG. 3b is a cross section along line A-A' of FIG. 3a. The substrate 100 may include silicon. In alternative embodiments, SiGe, bulk semiconductor, strained semiconductor, compound semiconductor, silicon on insulator (SOI), and other commonly used semiconductor substrates can be used for the substrate 100. The substrate 100 may be a substrate including transistors, diodes, bipolar junction transistors (BJT), resistors, capacitors, inductors or other electrical elements. Next, a plurality of bottom electrode 102 is formed on the substrate 100. Next, an isolation layer 104 is formed to cover the substrate, wherein each two adjacent bottom electrodes 102 are separated by the isolation layer 104. The isolation layer 104 can be a low temperature oxide layer such as silicon oxide, and can be formed by low pressure chemical vapor deposition (LPCVD). The isolation layer 104 can have a thickness of between 100 nm and 2000 nm, such as 400 nm.

In the embodiment, the bottom electrode 102 may include conductive metal material, such as Ru, Ir, Rh, Al, Co, W, Mo, Ti, Ta, Au, alloys thereof, laminations thereof, conductive nitrides thereof, conductive oxides thereof, or combinations thereof.

Figure 4A:
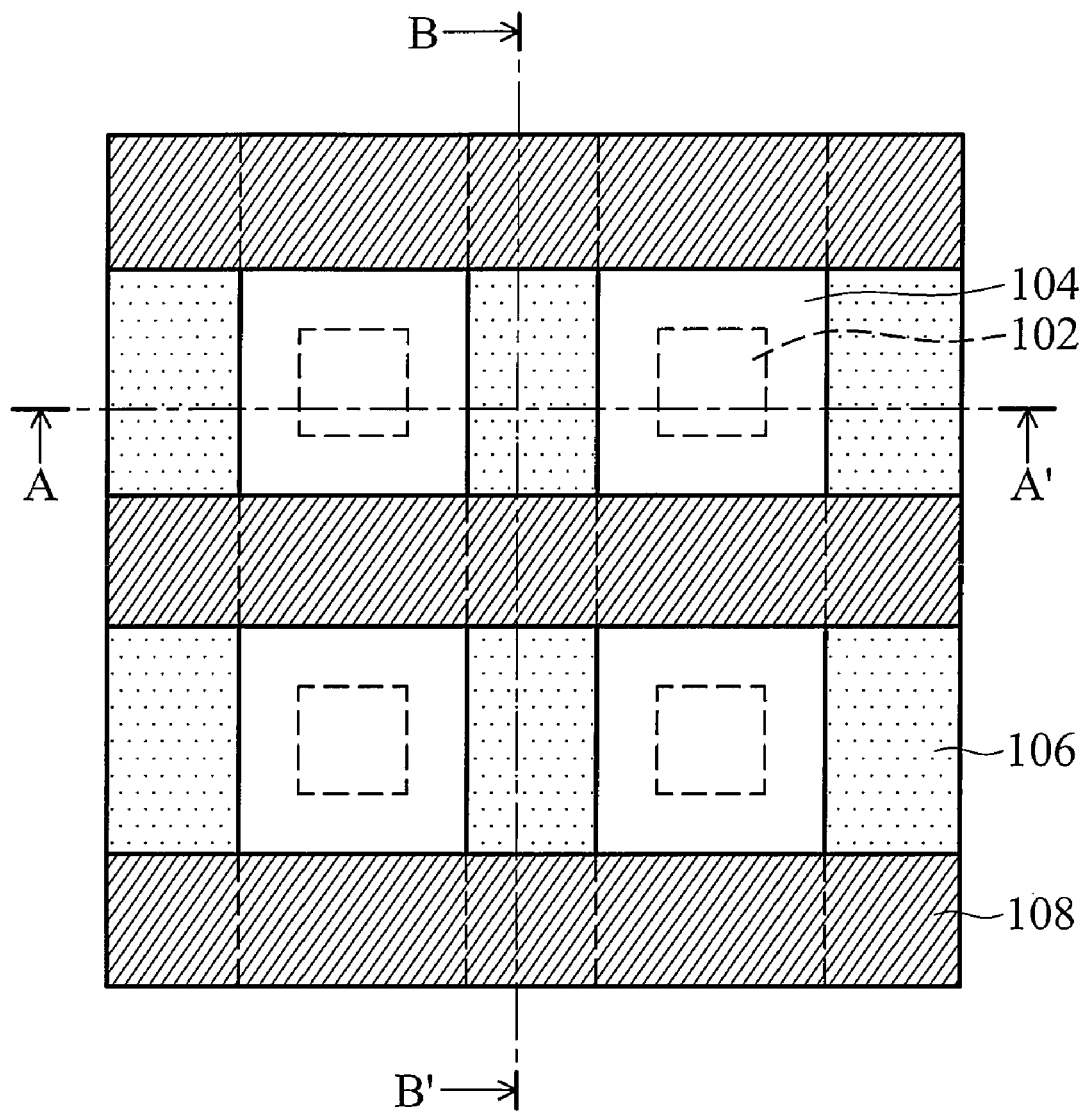
Figure 4B:
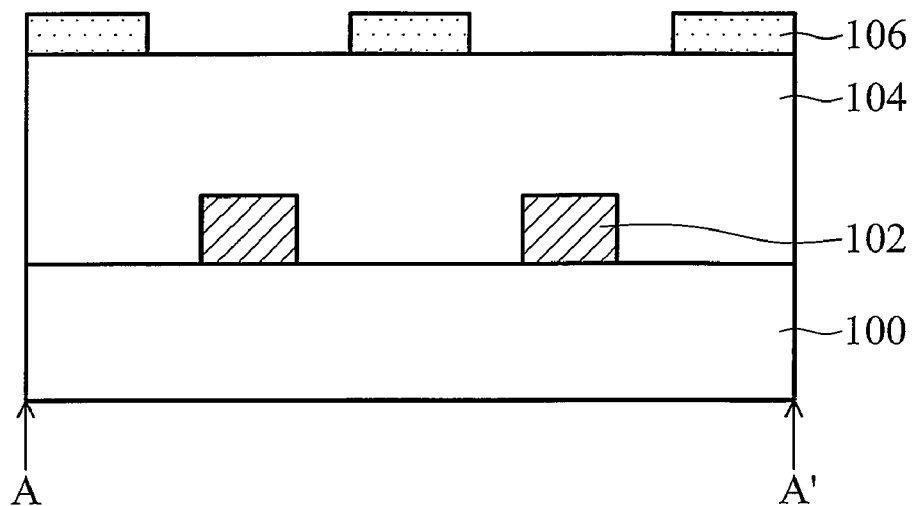
Figure 4C:
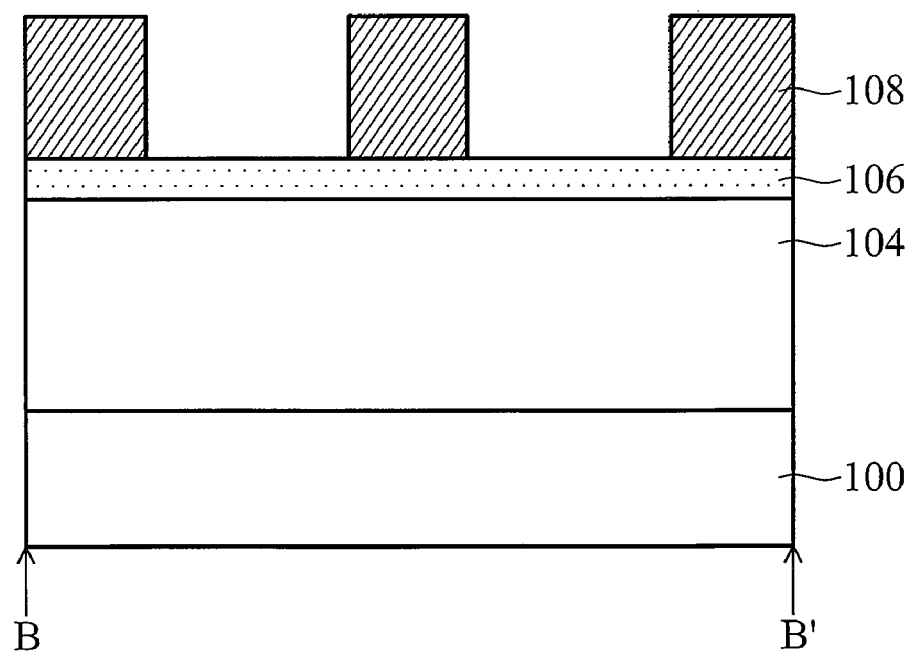

Next, referring to FIGS. 4a and 4b, a plurality of parallel patterned dielectric layers 106 is formed on the isolation layer 104, wherein the parallel patterned dielectric layers 106 extend along a first direction. Next, a plurality of parallel patterned photoresist 108 is formed on the isolation layer 104 and a part of the patterned dielectric layers 106, wherein the patterned photoresists 108 extend along a second direction. Particularly, the first direction is perpendicular to the second direction. FIG. 4c is a cross section along B-B' of FIG. 4a. The patterned dielectric layers 106 are perpendicular to the patterned photoresist 108. It should be noted that, the material of the dielectric layer 106 is different from that of the isolation layer 104. The dielectric layer 106 can be a low temperature nitride layer, such as silicon nitride and have a thickness of between 50 and 500 nm, such as 100 nm.

Figure 5A:
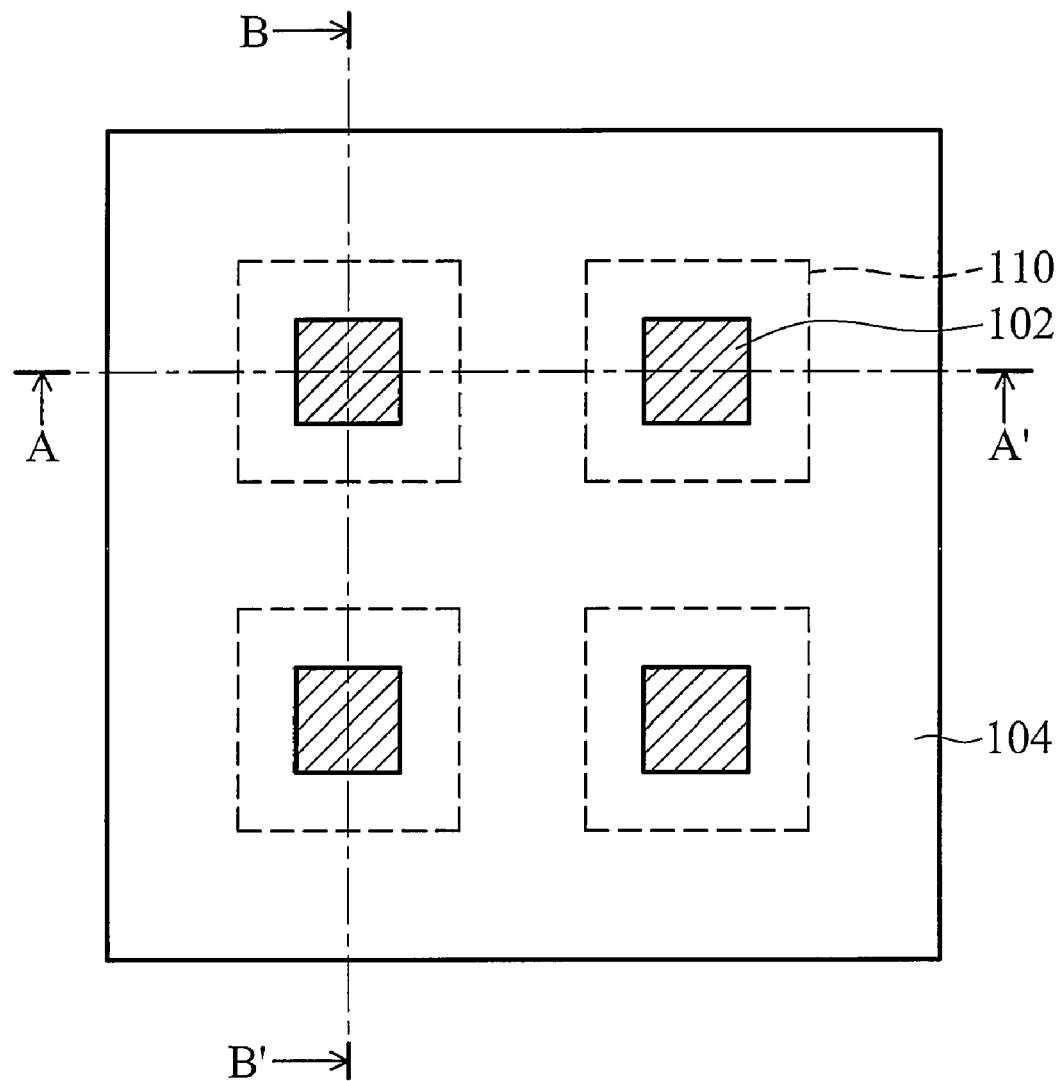
Figure 5B:
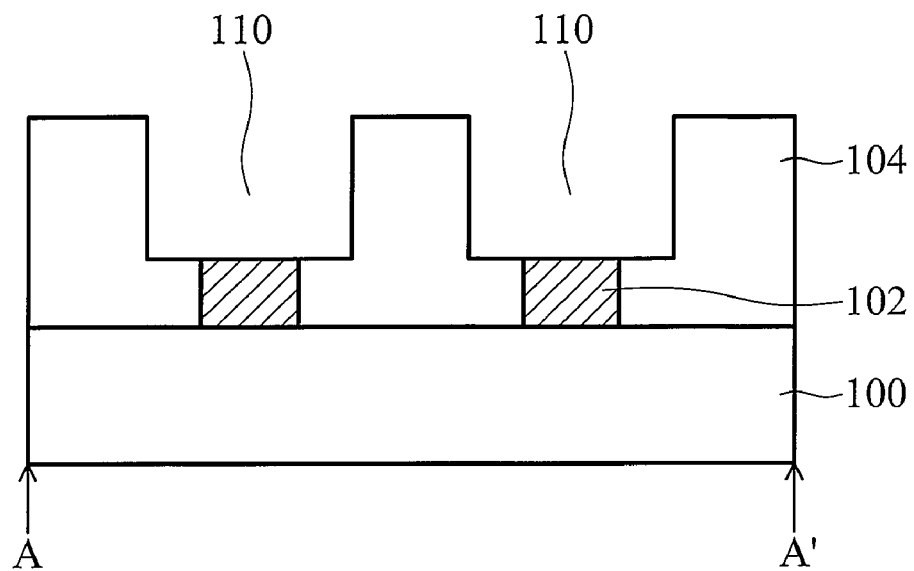
Figure 5C:
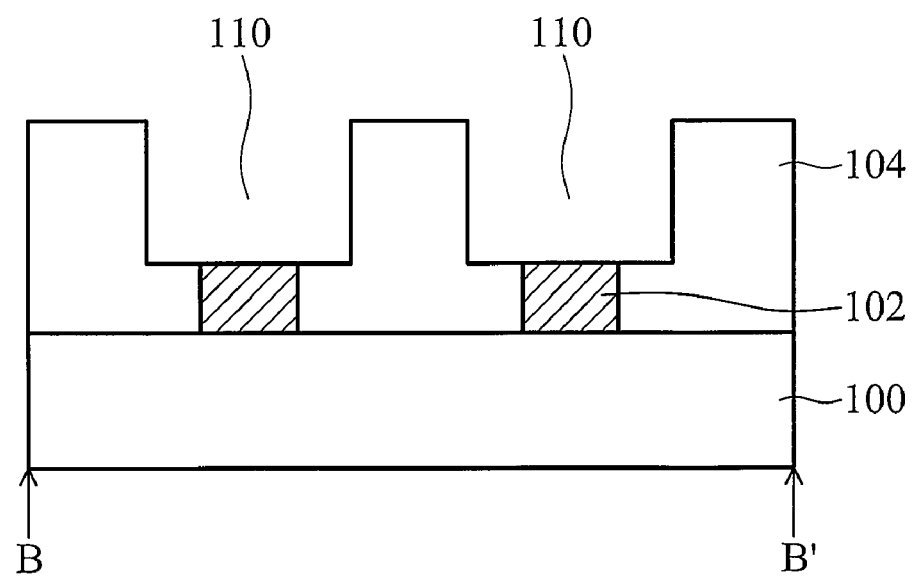

Next, referring to FIGS. 5a, 5b, and 5c, the isolation layer 104 is etched with the dielectric layer 106 and the photoresist 108 serving as an etching mask, forming an opening 110 exposing the top surface of the bottom electrode 102. It should be noted that, in this step, the isolation layer 104 has an etching rate exceeding that of the dielectric layer 106. In general, the etching rate of the isolation layer 104 is 5 times larger than that of the dielectric layer 106. After etching, the remaining dielectric layer 106 and photoresist 108 are removed.

Figure 6A:
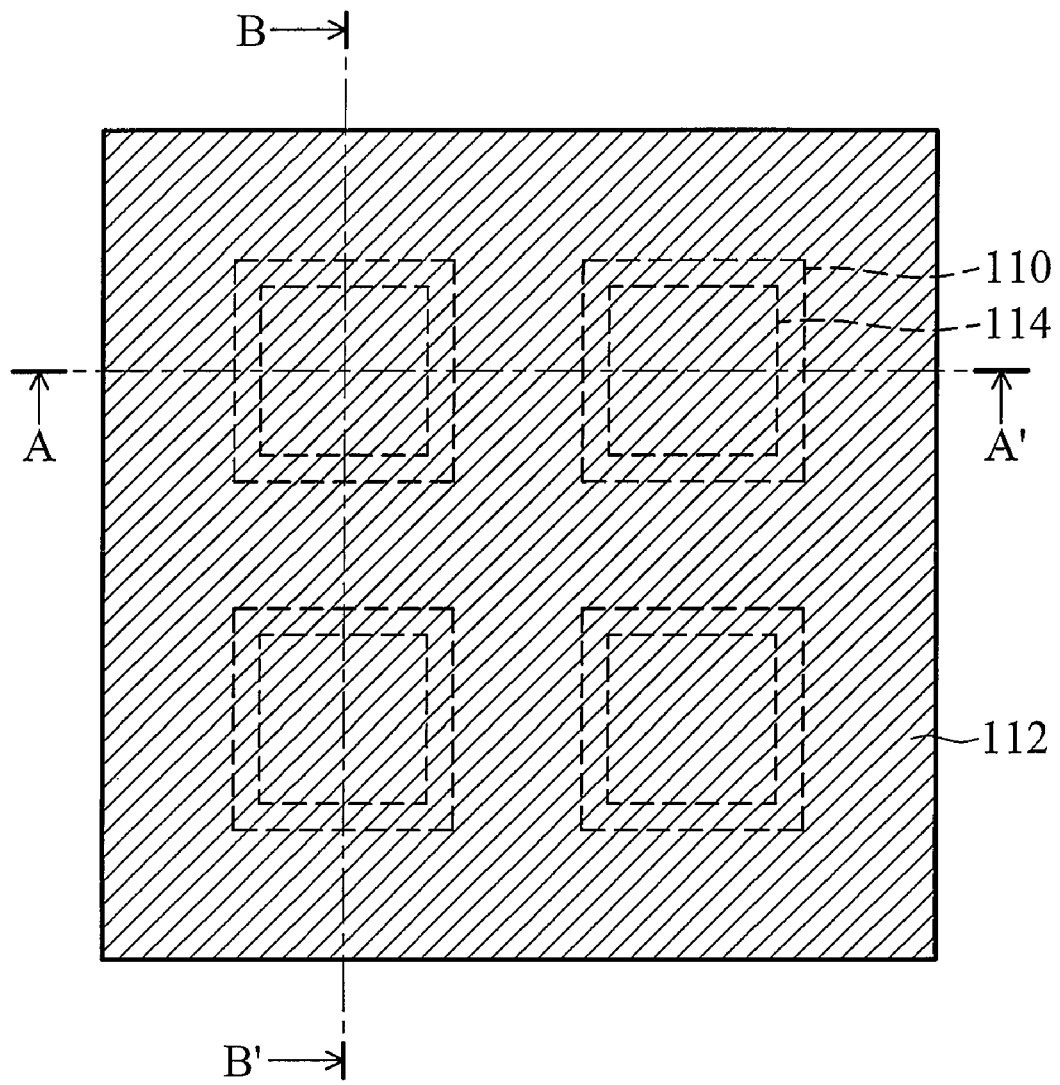
Figure 6B:
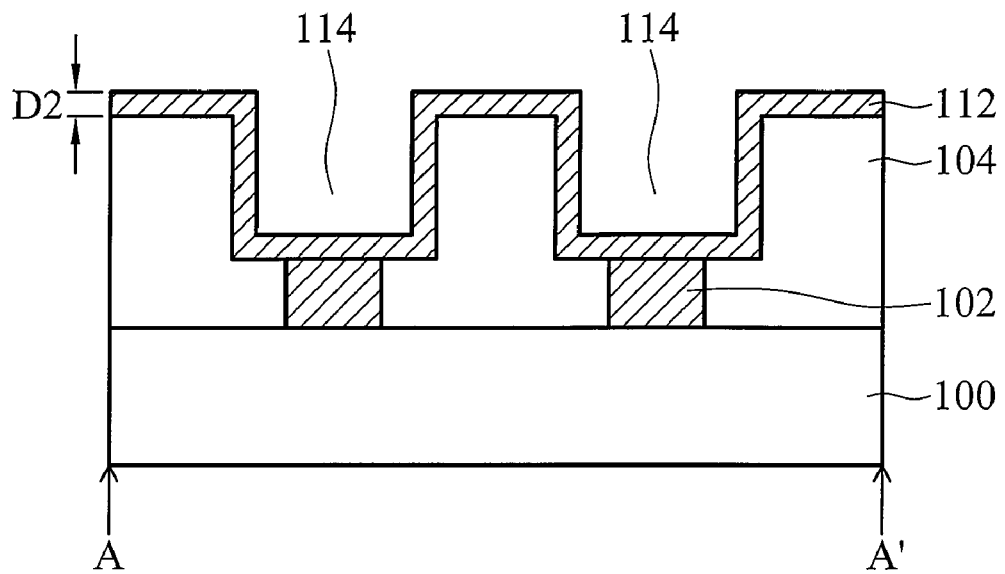
Figure 6C:
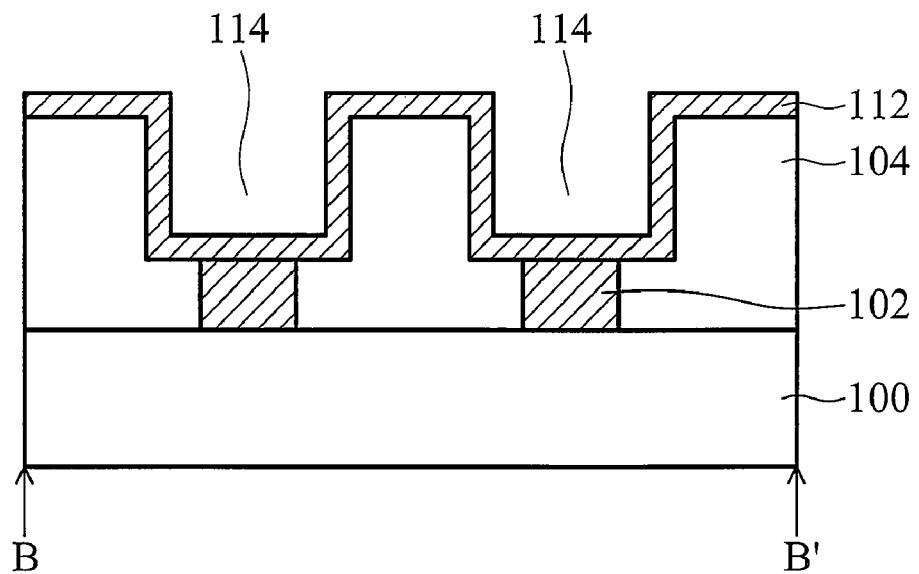

Next, referring to FIGS. 6a, 6b and 6c, a conductive layer 112 is conformally formed on the above structure, wherein the conductive layer 112 is also formed into the opening 110 to contact the top surface of the bottom electrode 102, defining an opening 114 with smaller dimensions. The conductive layer 112 can have a thickness D2 of between 5 and 100 nm, such as 50 nm. Suitable material of the conductive layer can include conductive metal material, such as Ru, Ir, Rh, Al, Co, W, Mo, Ti, Ta, Au, alloys thereof, laminations thereof, conductive nitrides thereof, conductive oxides thereof, or combinations thereof.

Figure 7A:
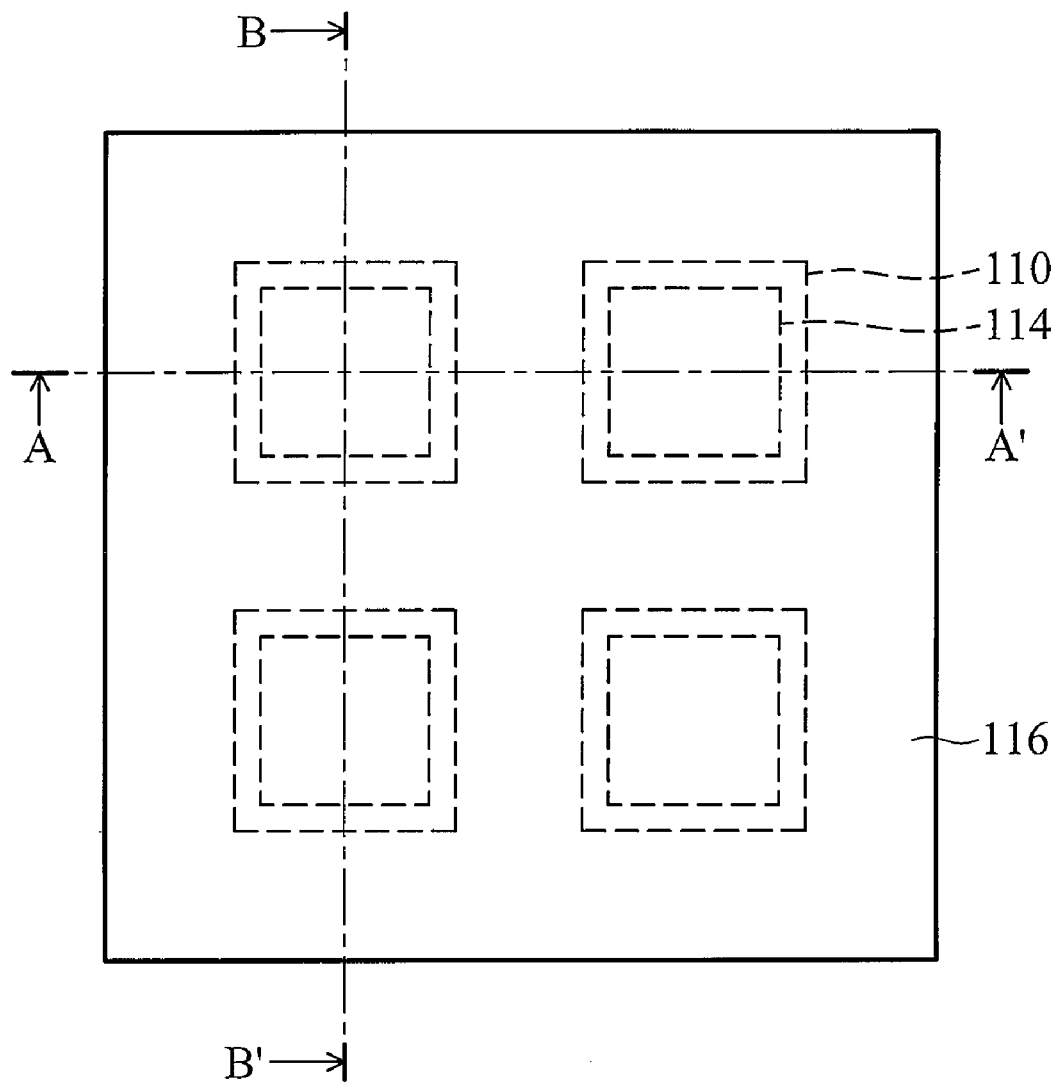
Figure 7B:
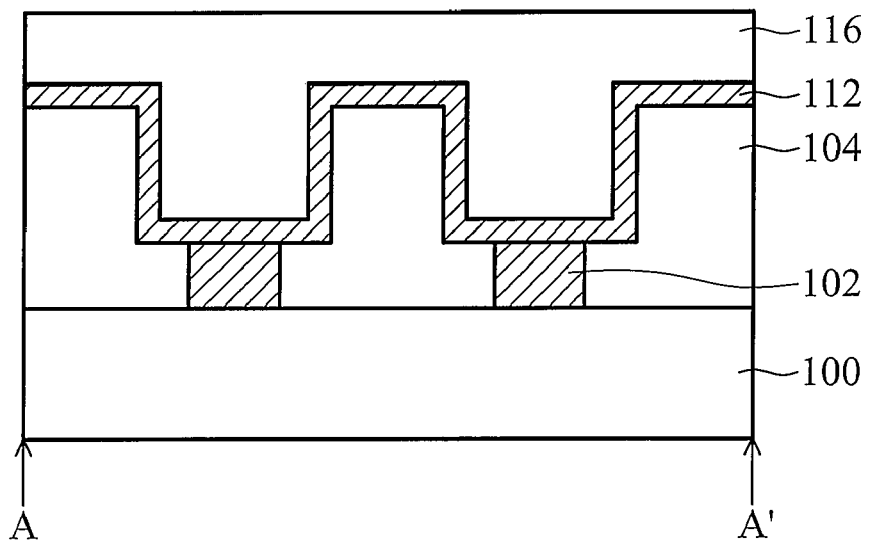
Figure 7C:
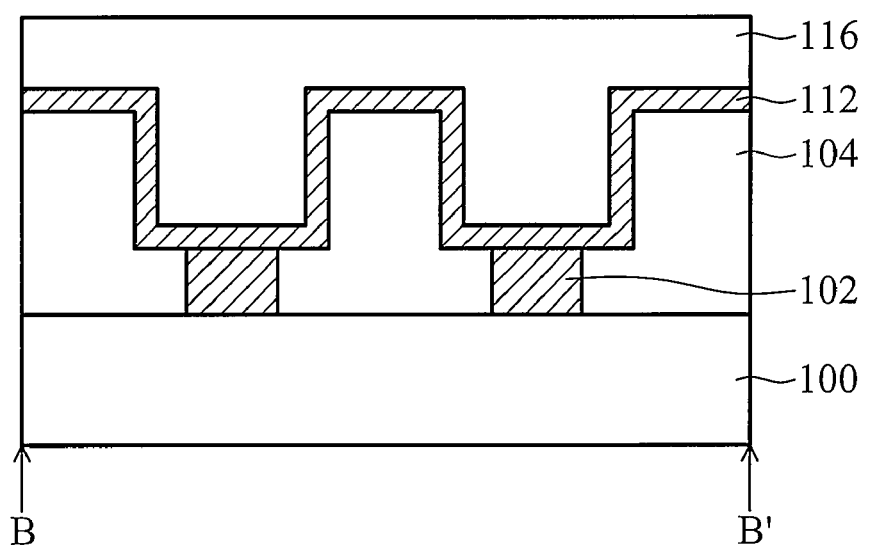

Next, referring to FIGS. 7a, 7b and 7c, an isolation layer 116 is blanketly formed on the conductive layer 112 to fill the opening 114. The isolation layer 116 can be a low temperature oxide layer, such as silicon oxide, and can be formed by low pressure chemical vapor deposition (LPCVD). The isolation layer 116 can have a thickness of between 100 nm and 500 nm, such as 250 nm.

Figure 8A:
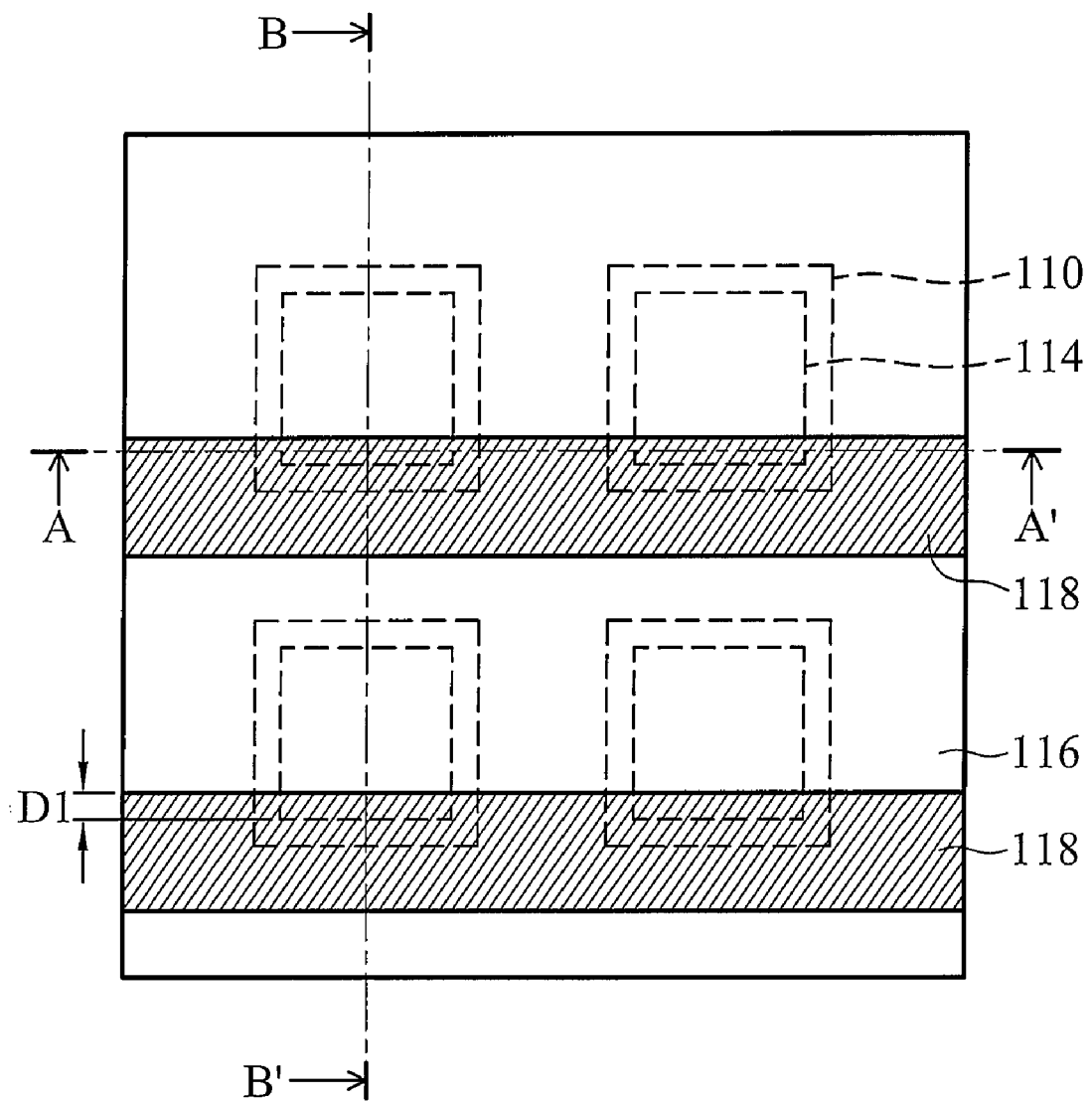
Figure 8B:
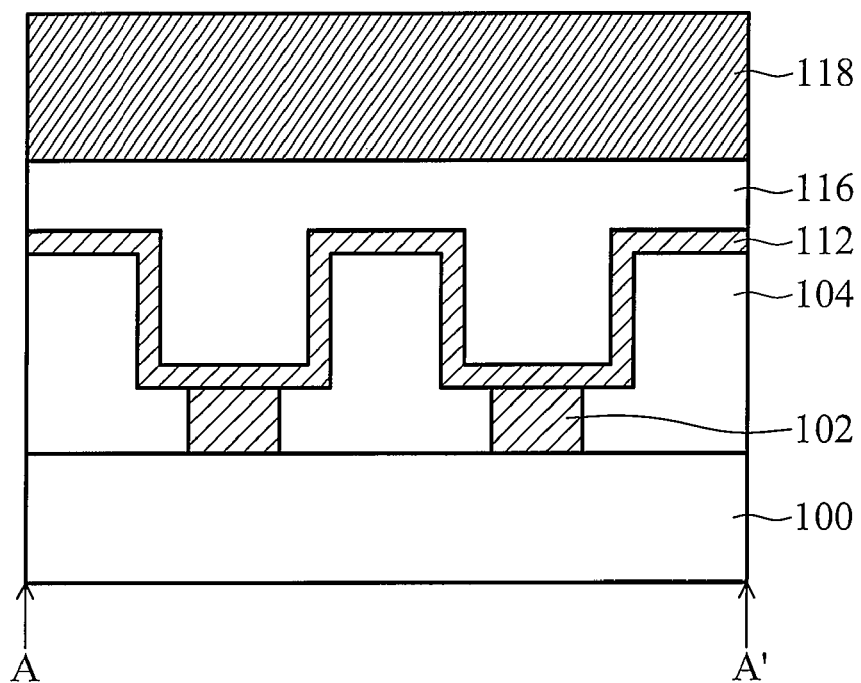
Figure 8C:
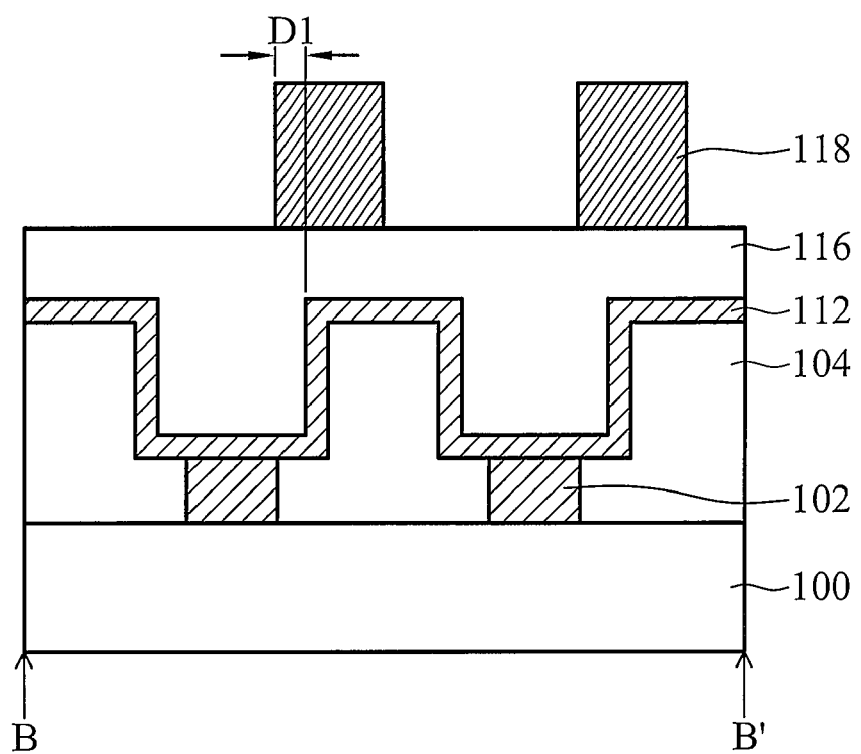

Next, referring to FIGS. 8a, 8b and 8c, a plurality of parallel patterned photoresist 118 is formed to extend along the second direction, wherein the photoresist 118 covers a part of the opening 114. Particularly, referring to FIG. 8c, the overlapping width D1 between the patterned photoresist 118 and the opening 114 is of between 5 and 200 nm, such as 100 nm. The overlapping width D1 depends on the dimension of the opening 114. The smallest overlapping area can be equal to the width of conductive layer 112 formed on the sidewall of the opening 110, and the largest overlapping area can be equal to the width between the two opposite sidewalls of the opening 110. In general, the overlapping width D1 can be half of the width of the opening 110. It should be noted that the photoresist 118 must cover the conductive layer 112 formed on one sidewall of the opening 110 and the isolation layer 116 formed on the conductive layer 112, preventing them from being etched by subsequent etching processes.

Figure 9A:
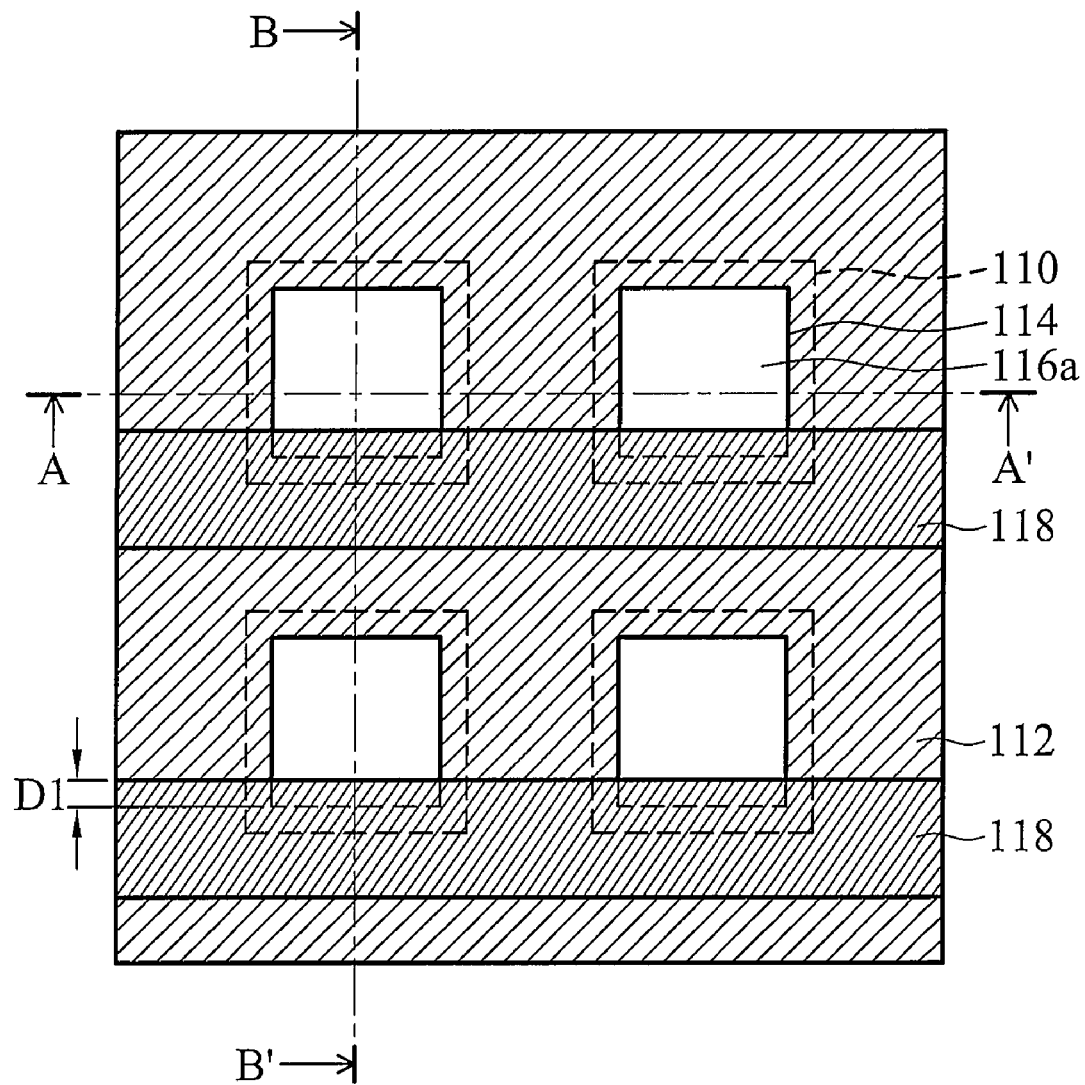
Figure 9B:
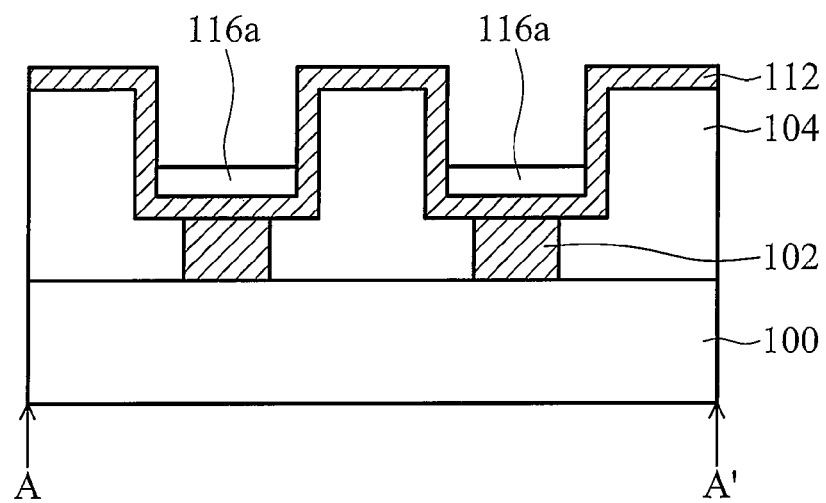
Figure 9C:
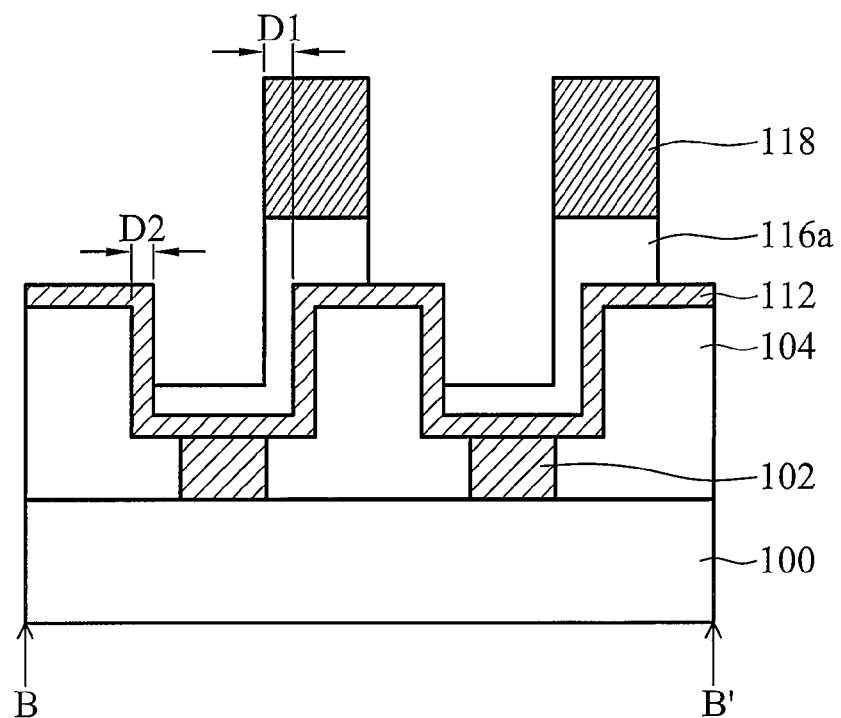

Next, referring to FIGS. 9a, 9b and 9c, the isolation layer 116 is etched with the patterned photoresist 118 as an etching mask, leaving the isolation layer 116a, formed on the bottom of the opening 114, with a specific thickness. In this step, the isolation layer formed on the conductive layer 112 is completely removed, except for the isolation layer 116a which is covered by the photoresist or formed on the bottom of the opening 114.

It should be noted that, the ratio between the thickness of the remaining isolation layer 116a (formed on the bottom of the opening 114) and the depth of the opening 114 can be more than 1:4 (such as 1:10). The remaining isolation layer 116 (formed on the bottom of the opening 114) protects the conductive layer 112 from broken circuits due to over-etching.

Referring to FIG. 9c, the remaining isolation layer 116a completely covers the bottom and one sidewall of the opening 114, and the remaining isolation layer 116a formed on the sidewall of the opening 114 covers the conductive layer 112 formed within the opening 110. Herein, the etching process includes dry etching.

Figure 10A:
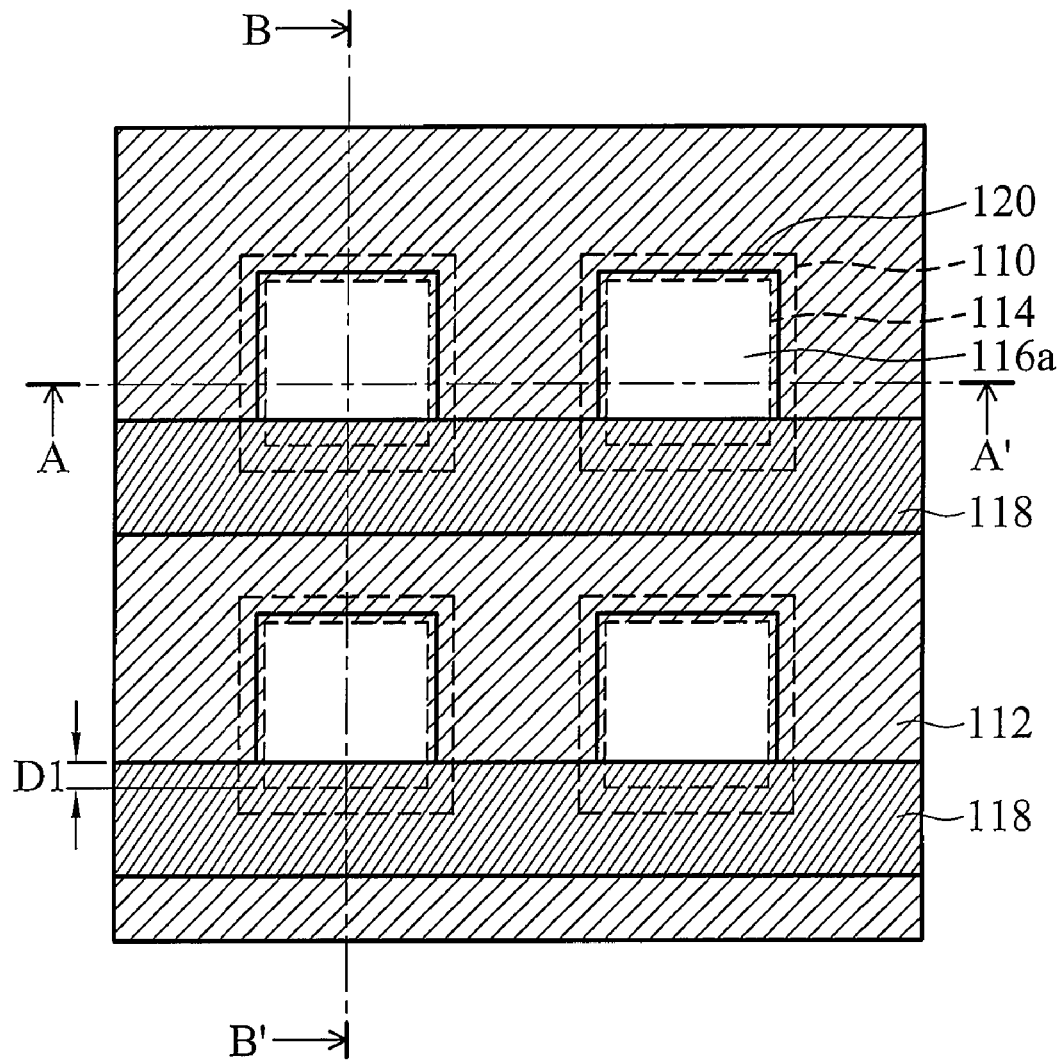
Figure 10B:
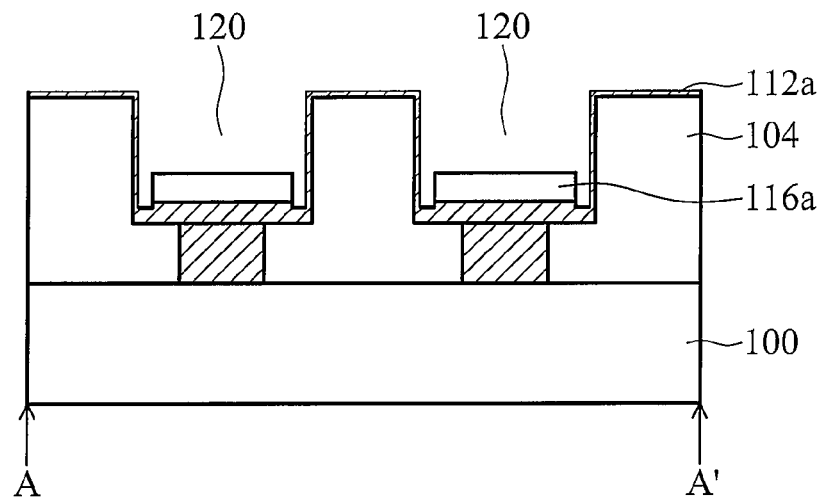
Figure 10C:
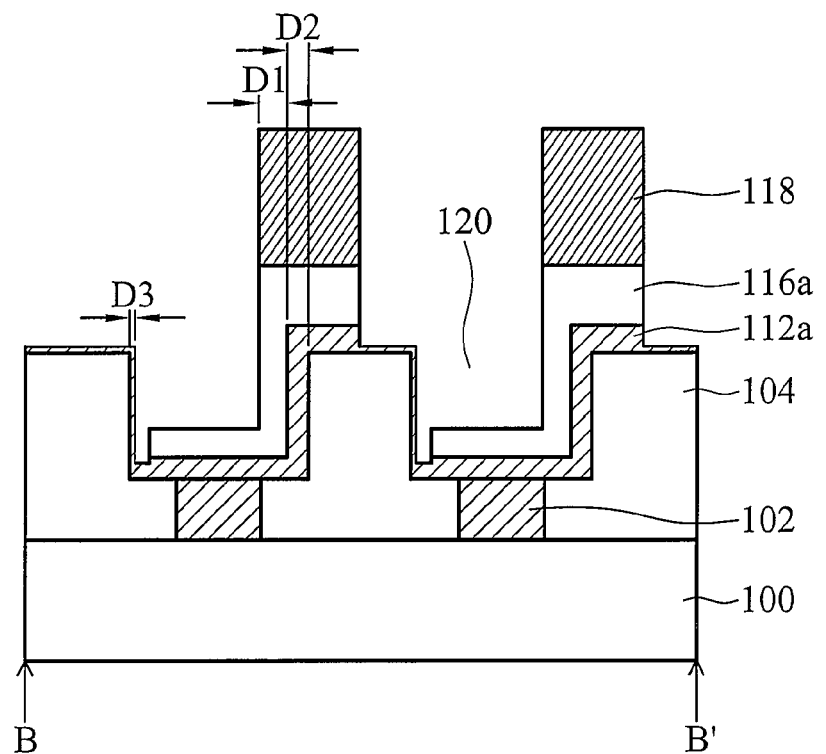

Next, referring to FIGS. 10a, 10b and 10c, the exposed conductive layer 112 (uncovered by the remaining isolation layer 116a) is subjected to a trimming process, reducing the thickness thereof. The trimmed conductive layer 112a has a thickness D3. The ratio between the thickness D3 and the thickness D2 of the original conductive layer 112 is between 1:2~1:10. For example, the thickness D3 can be 5 nm.

The trimming process is not limited to a certain process, and can be a dry trimming process (such as plasma trimming process) or a solution trimming process. Herein, the trimmed conductive layer 112a and the remaining isolation layer 116a define an opening 120.

Figure 11A:
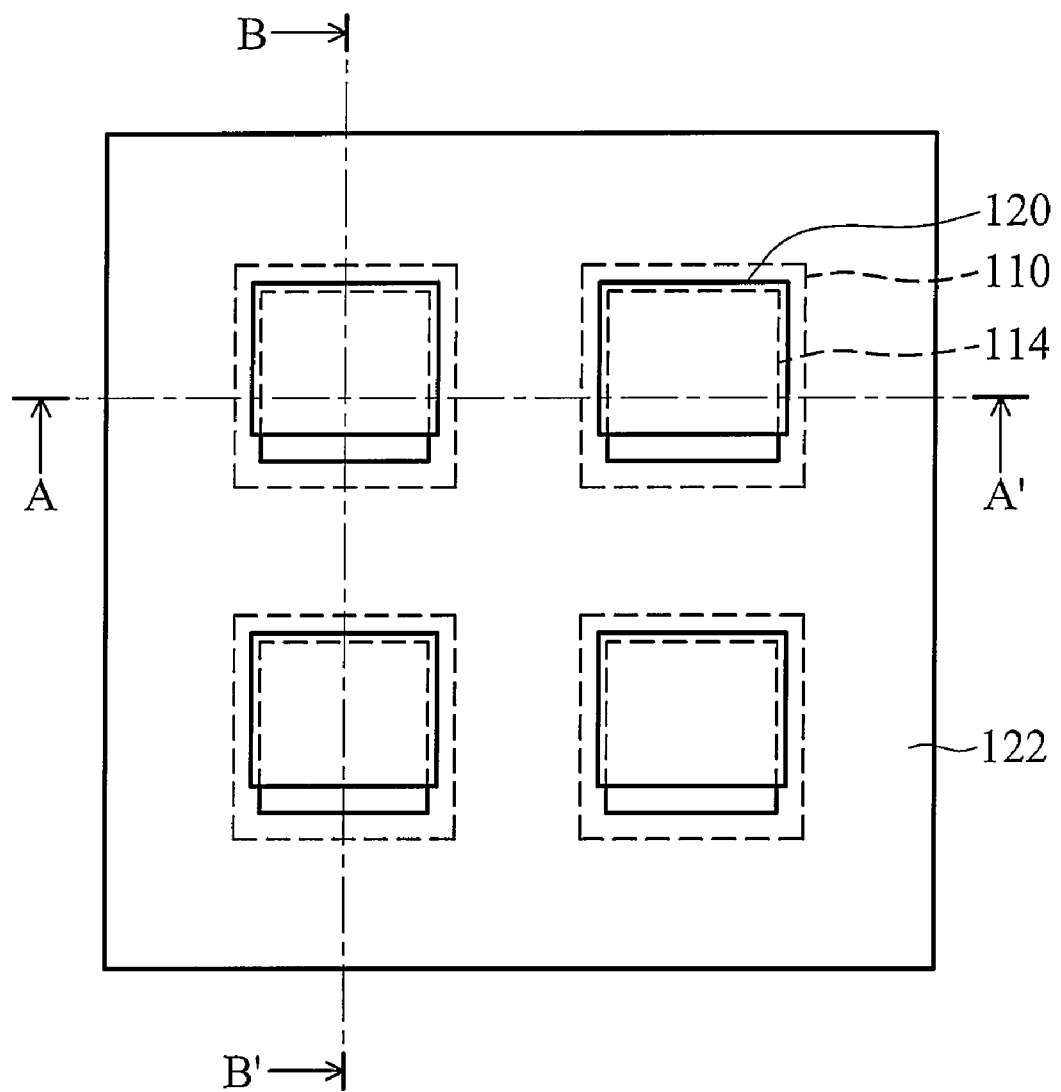
Figure 11B:
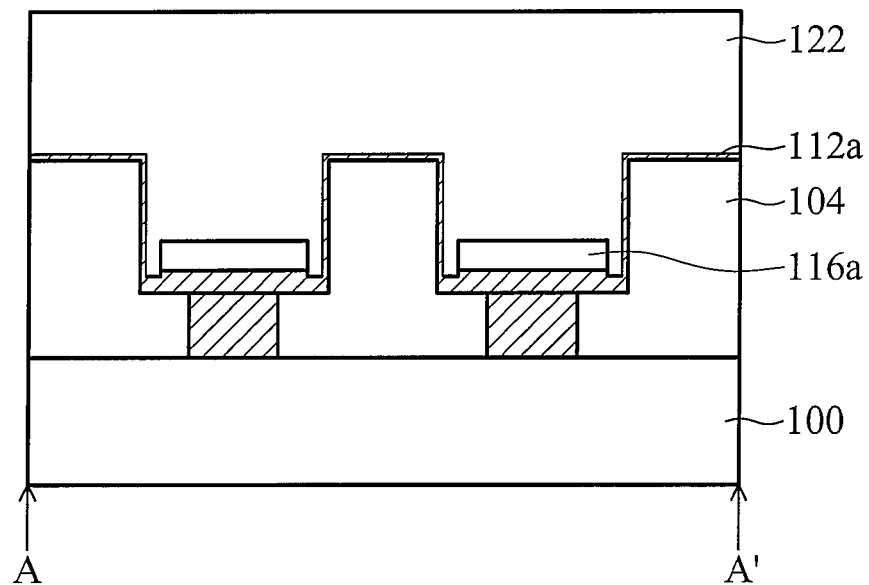
Figure 11C:
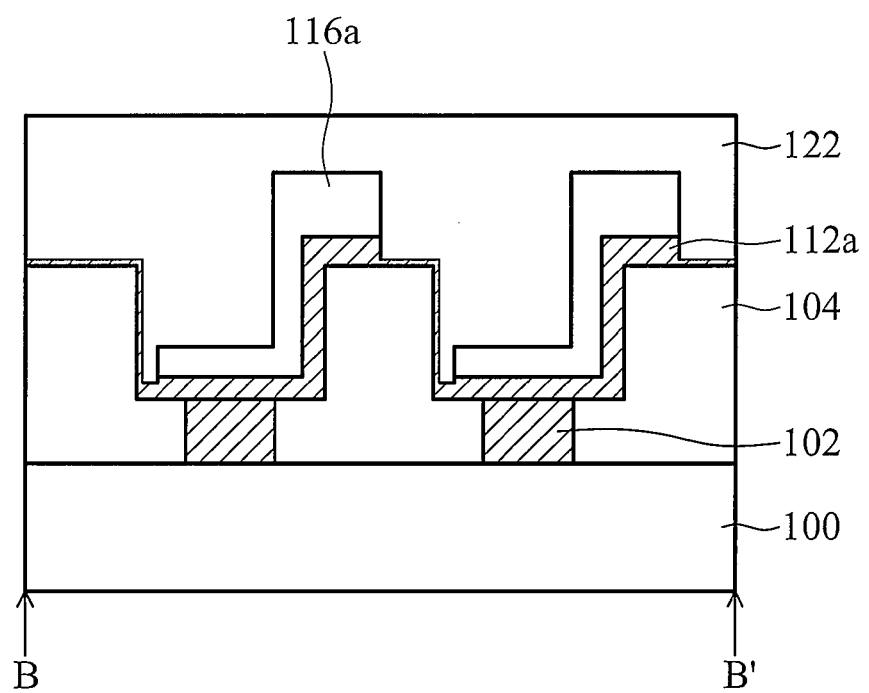

Next, referring to FIGS. 11a, 11b and 11c, the photoresist 118 is completely removed, and an isolation layer 122 is blanketly formed to fill the opening 120. The isolation layer 122 can be a low temperature oxide layer such as silicon oxide, and can be formed by low pressure chemical vapor deposition (LPCVD).

Figure 12A:
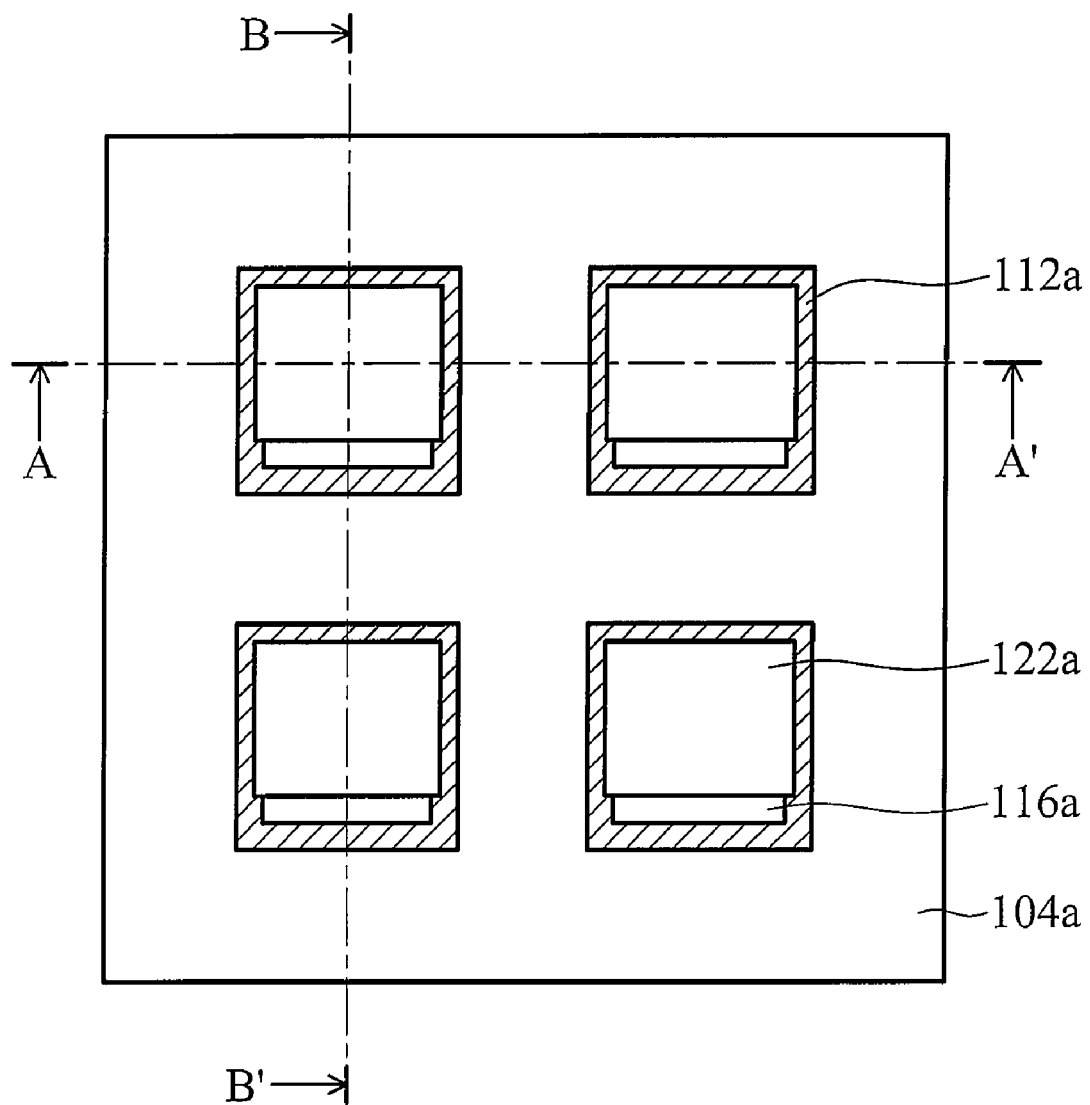
Figure 12B:
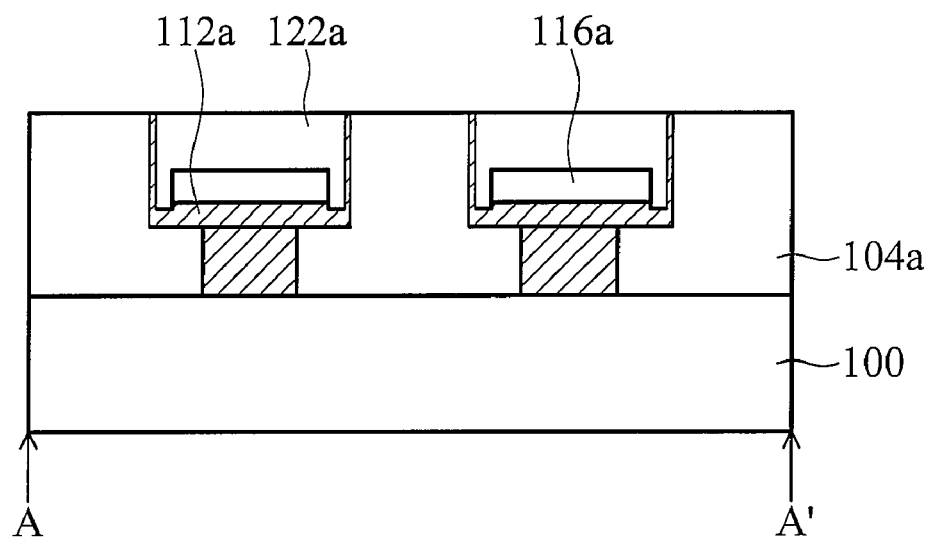
Figure 12C:
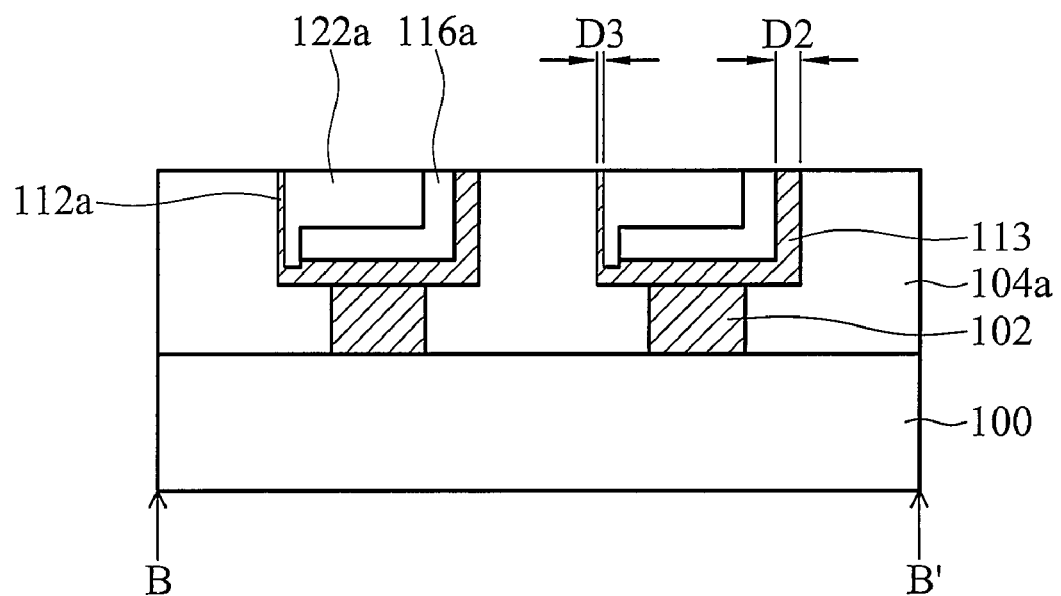

Next, referring to FIGS. 12a, 12b and 12c, the isolation layer 122, the remaining isolation layer 116a, and the conductive layer 112 and 112a are subjected to a planarization process, obtaining the structure shown in FIG. 12C. After planarization, the remaining isolation layers 104a and 122a are obtained, and the remaining conductive layer has a cup-shaped conductive structure (conductive structure with a cavity) 113. Still referring to FIG. 12c, the cup-shaped conductive structure 113 includes sidewalls with different thicknesses D2 and D3. The planarization includes chemical mechanical polishing (CMP).

Figure 13A:
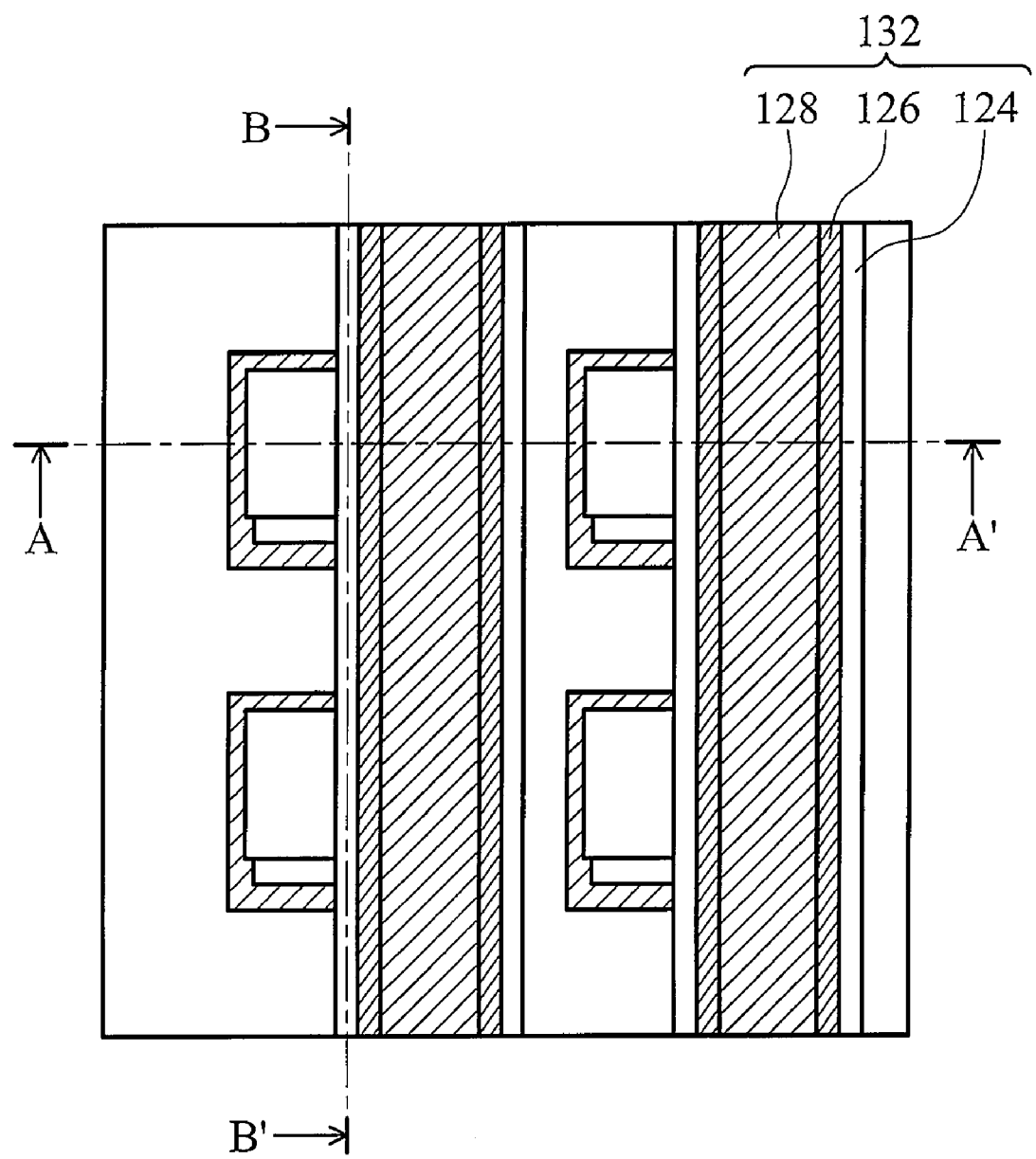
Figure 13B:
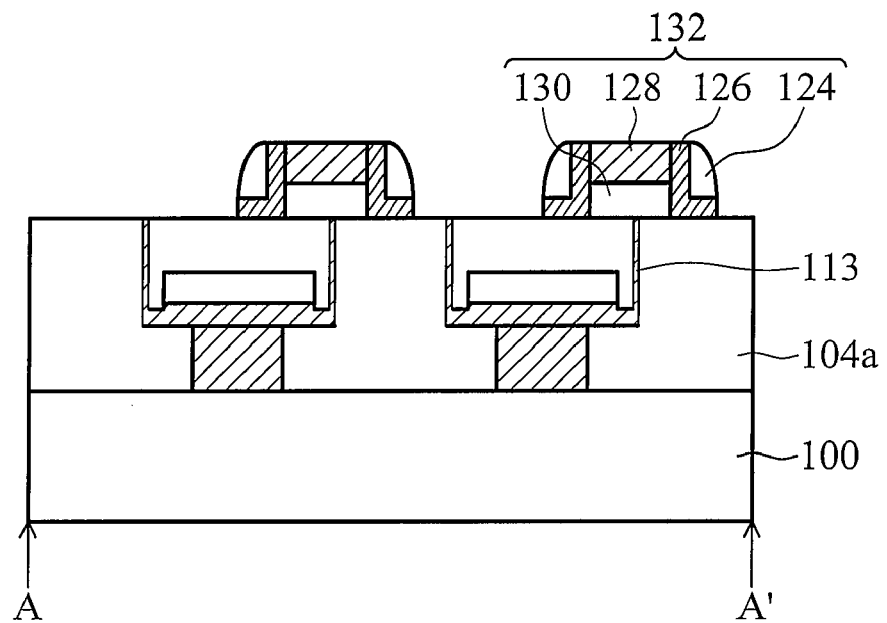
Figure 13C:
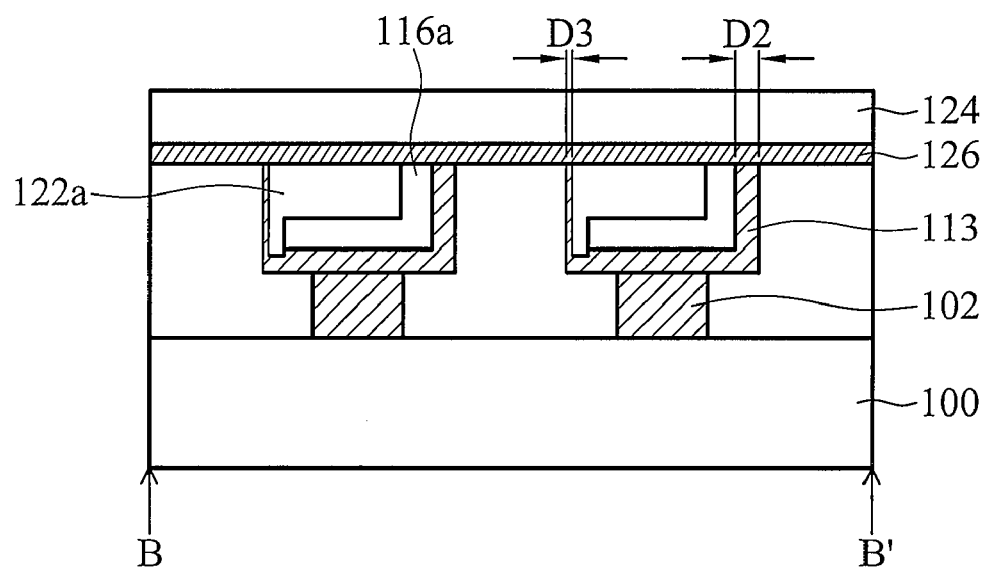

Finally, referring to FIGS. 13a, 13b and 13c, an electrode structure 132 with two overlapping spacers is formed, extending in a first direction. The electrode structure 132 covers part of the cup-shaped conductive structure 113. Specifically, the electrode structure 132 includes a bottom isolation layer 130, a top electrode 128, a phase change spacer 126, and an isolation spacer 124. The isolation spacer 124 is optionally formed on the phase change spacer 126. The top electrode 128 include conductive metal material, such as Ru, Ir, Rh, Al, Co, W, Mo, Ti, Ta, Au, alloys thereof, laminations thereof, conductive nitrides thereof, conductive oxides thereof, or combinations thereof. The phase change spacer 126 includes a binary chalcogenide, ternary chalcogenide, quarternary chalcogenide, or non-chalcogenide phase change material, such as GaSb, GeTe, Ge—Sb—Te, Ag—In—Sb—Te or combinations thereof.

In the embodiment, the thickness of the phase change spacer is of between 1 and 200 nm, and can be formed by a deposition process, such as, physical vapor deposition (PVD), thermal evaporation, pulsed laser deposition or metal organic chemical vapor deposition. The isolation spacer 124 can be a low temperature layer (formation temperature 250-350° C.), such as silicon oxide, silicon nitride, silicon oxynitride, or combinations thereof, and can be formed by plasma enhanced chemical vapor deposition. The bottom isolation layer 130 can include silicon dioxide ($SiO_2$), oxide-nitride-oxide (ONO), nitride-oxide (NO) or silicon nitride ($Si_3N_4$). Alternatively, the first gate insulating layer 236 may also include high dielectric constant (k) (k>8) dielectric materials, such as, aluminum oxide ($Al_2O_3$), hafnium oxide (HfOx), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O_3$), lanthalum oxide ($La_2O_3$), cerium oxide ($CeO_2$), titanium oxide ($TiO_2$), tantalum oxide ($Ta_2O_5$) or combinations thereof.

The contact area (intersection) between the phase change spacer 126 and the cup-shaped conductive layer 113 can be decided by the thickness of the phase change spacer 126 and the conductive layer 113. Accordingly, the heating area is less than that of conventional phase change memory element formed by photolithography and can be accurately adjusted. Further, the interval between the cup-shaped conductive layers 113 can be less than the resolution limit of the photolithography process.

Referring to FIG. 13c, in a single phase change memory element of the invention, since the phase change spacer 126 are respectively intersected to the sidewalls with different thicknesses D2 and D3 of the cup-shaped conductive layer 113, the intersections between the phase change spacer 126 and the cup-shaped conductive layer 113 have different square measures, thereby achieving multi-bits memory application.

Figure 14:
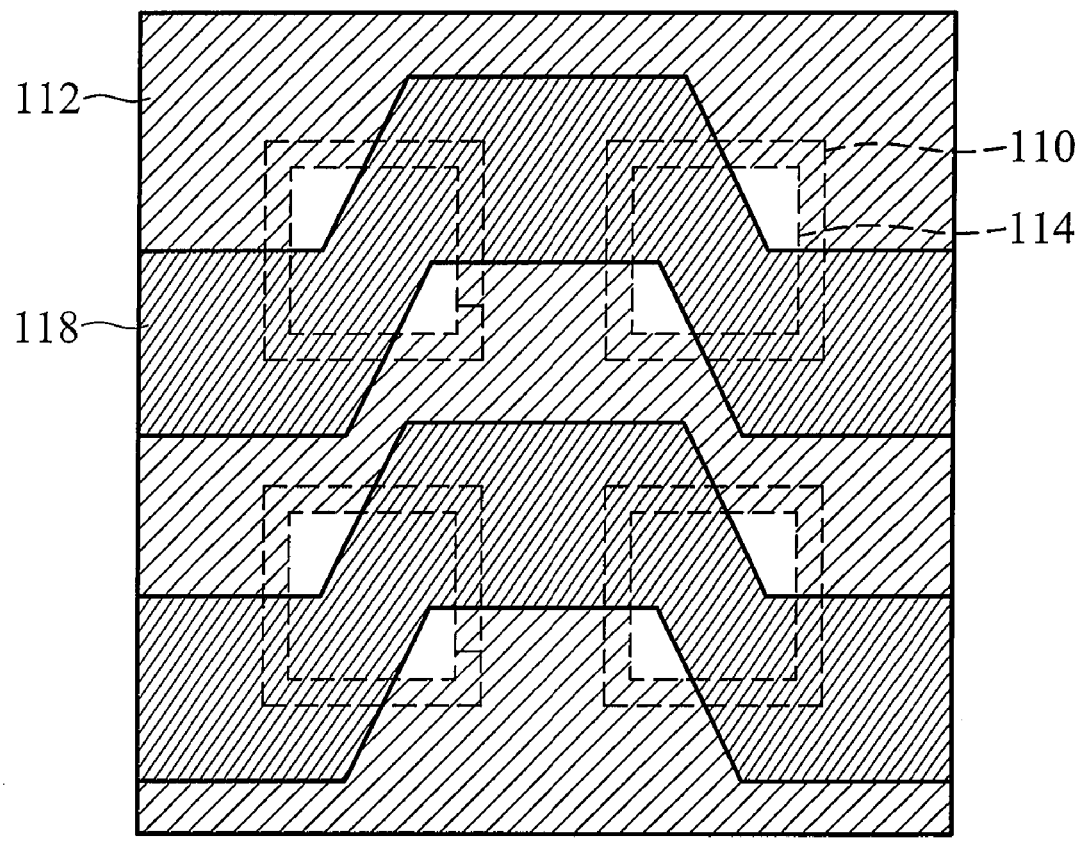
FIG. 14 is a top view of a phase change memory element according to another embodiment of the invention, illustrating that the patterned photoresist can be have various designs.

Further, according to another embodiment of the invention, after the process shown in FIG. 7a is complete, the subsequently formed photoresist 118, except for the rectangle-shaped photoresist (shown in FIG. 8a), can also be parallelogram-shaped with a specific winding angle (such as 45°, shown in FIG. 14). Therefore, the obtained intersections between the phase change spacer 126 and the cup-shaped conductive layer 113 can also have different square measures.

Figure 15A:
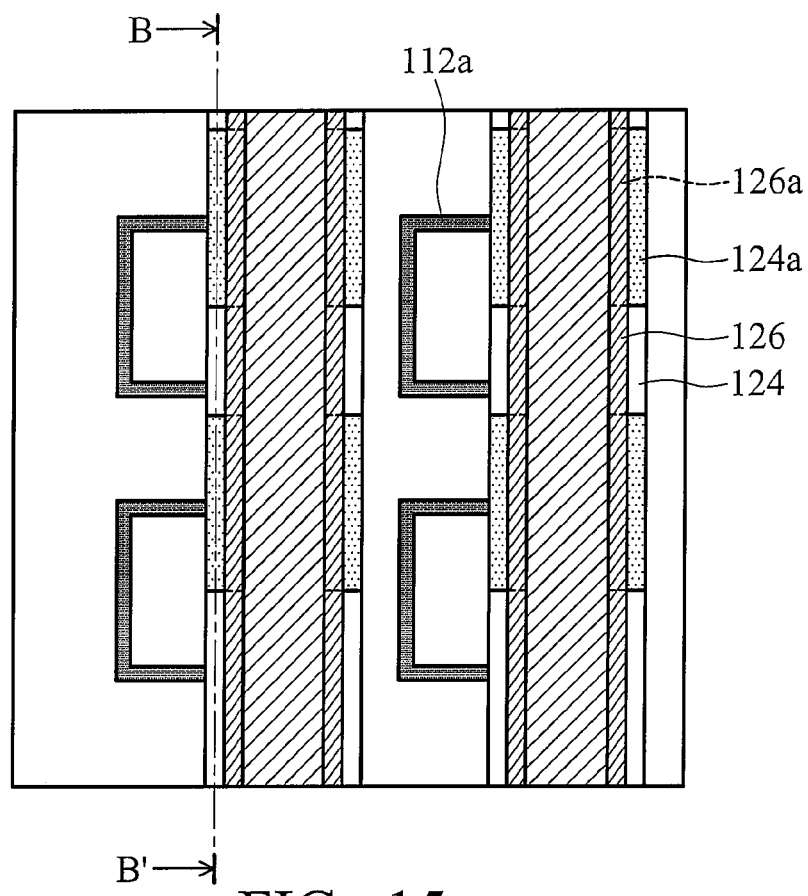
FIG. 15a is a top view of a phase change memory element according to yet another embodiment of the invention.
Figure 15B:
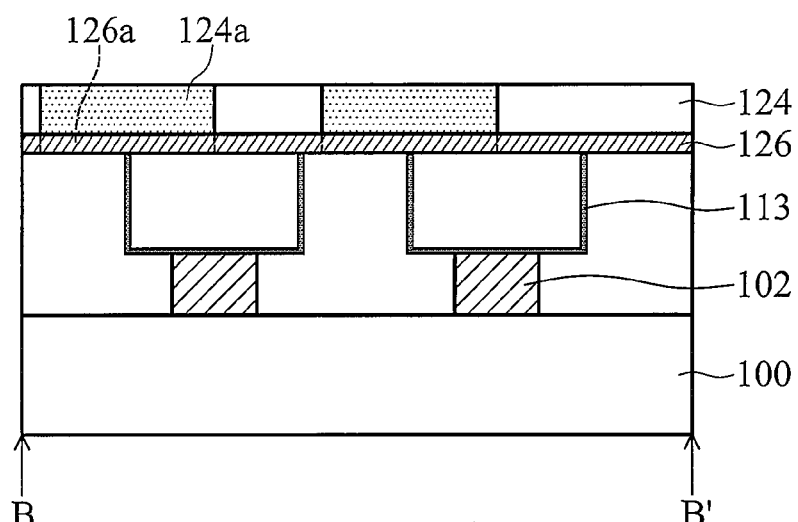

Moreover, according to yet another embodiment of the invention, the multi-bits memory application can be achieved by doping (or non-doping) the phase change spacer 126 intersected with the cup-shaped conductive layer 113. Referring to FIG. 15a, a part of the phase change spacer 126 is subjected to a nitrogen (or oxygen, fluorine) doping process, defining doped phase change spacer 126a (and a doped isolation layer 124a) and non-doped phase change spacer 126 (and a non-doped isolation layer 124). FIG. 15b is a cross section along line B-B' of FIG. 14a. As shown in FIG. 15b, the doped area 126a and non-doped area 126 of the phase change spacer simultaneously intersected to the cup-shaped conductive layer 113 exhibit different resistivity, even though the sidewalls of the cup-shaped conductive layer 113 have the same thicknesses.

Figure 16A:
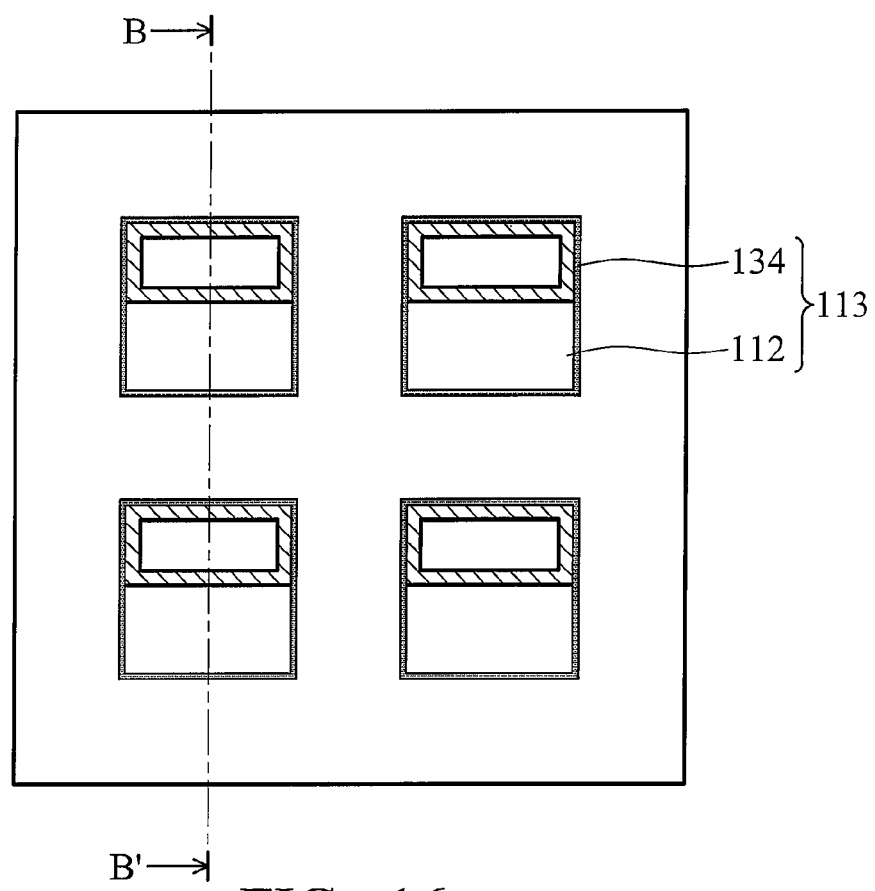
FIGS. 16a and 17a are top views of a phase change memory element according to other embodiments of the invention.
Figure 17A:
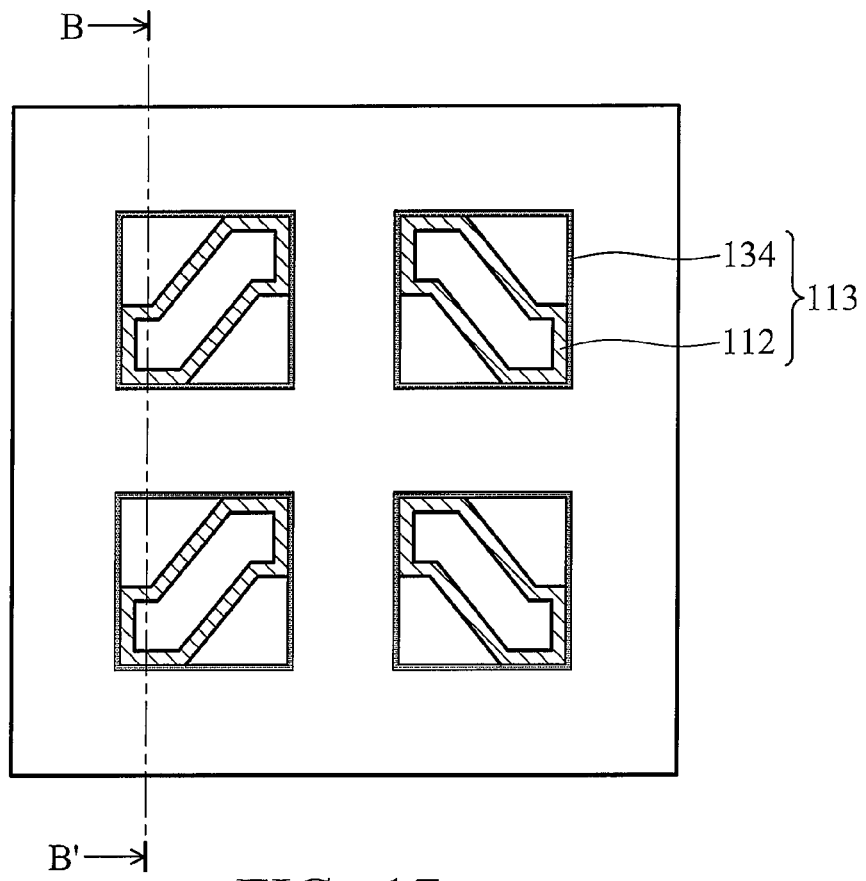

Further, in some embodiments of the invention, the cup-shaped conductive layer 113 can further be designed to have more than two different thicknesses, such as three different thicknesses. Referring to FIGS. 16a and 17a, the cup-shaped conductive layer 113 can further include a cup-in-cup structure which have three sidewalls with different thicknesses along line B-B'. Accordingly, there are three intersections with different square measures between the cup-shaped conductive structure and the phase change spacer, resulting in a multi-bit memory element.

Figure 16B:
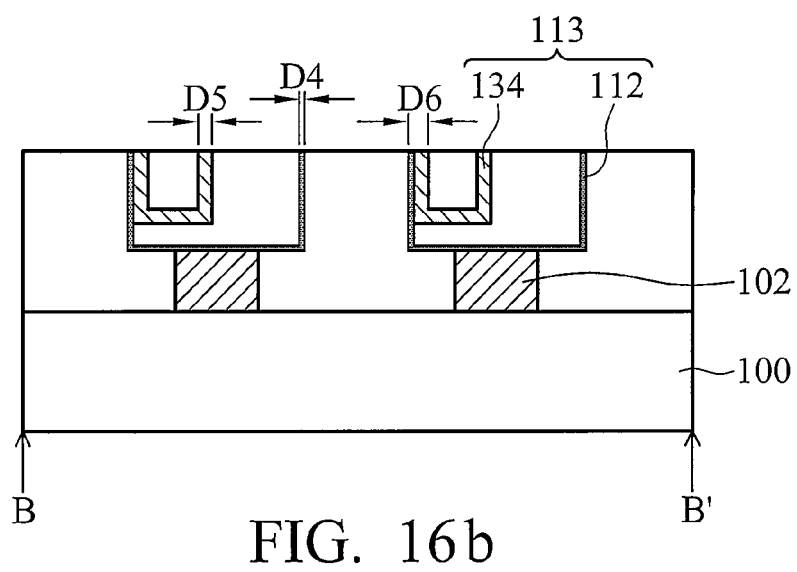
Figure 17B:
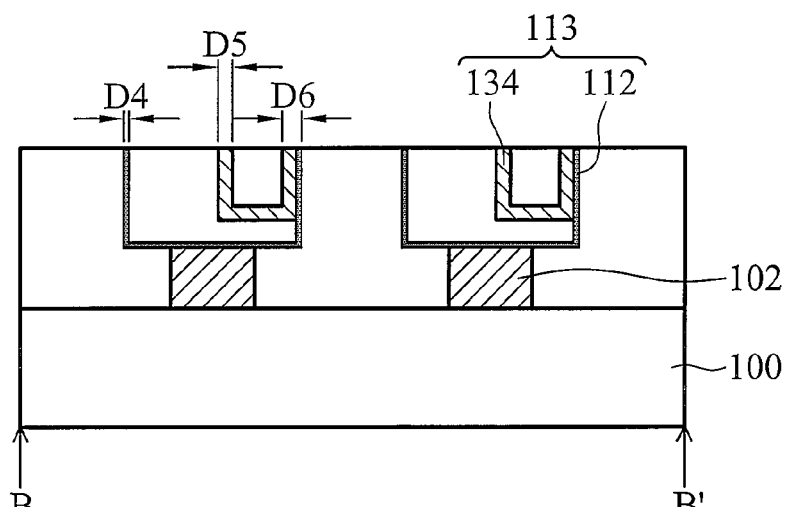

Referring to FIGS. 16b and 17b, the method for forming the cup-in-cup structure conductive layer 113 first includes forming a cup-shaped conductive layer 112 with a thickness D4. Next, a smaller cup-shaped conductive layer 134 is formed within the cup-shaped conductive layer 112, wherein the smaller cup-shaped conductive layer 134 has a thickness D5. It should be noted that, at least one sidewall (at most three sidewalls) of the cup-shaped conductive layer 134 contacts to the cup-shaped conductive layer 112, except for the bottom. The thicknesses D4 and D5 are different, and the total of the thicknesses D4 and D5 equal to the thickness D6. In the embodiment of the invention, a single phase change memory element can have multi-bit rather than conventional single-bit. The multi-bit phase change memory element can be achieved not only by varying the square measure of the intersection between the conductive layer and the phase change spacer but also optionally doping the phase change spacer.

Figure 18A:
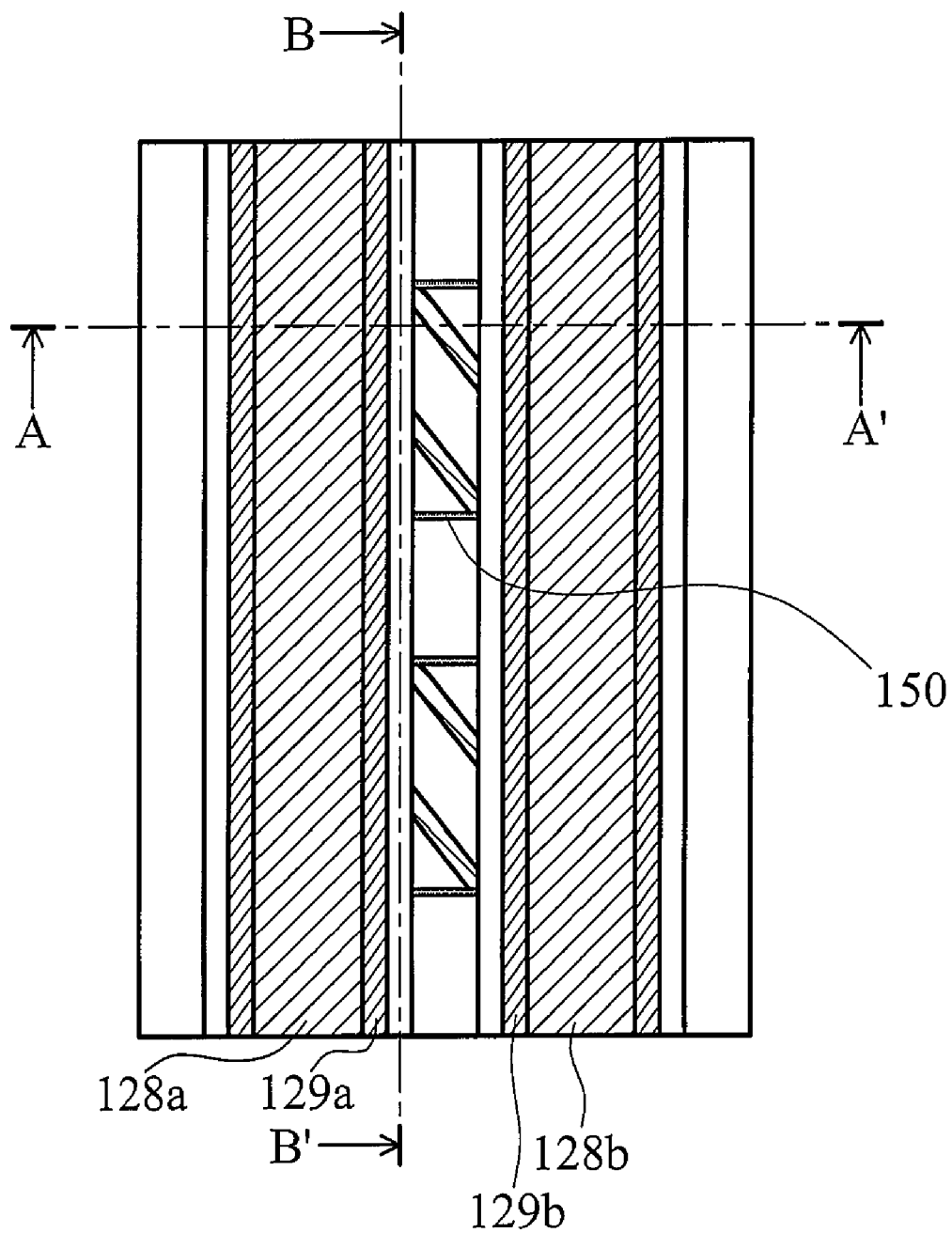
FIG. 18a is a top view of a phase change memory element according to still another embodiment of the invention.
Figure 18B:
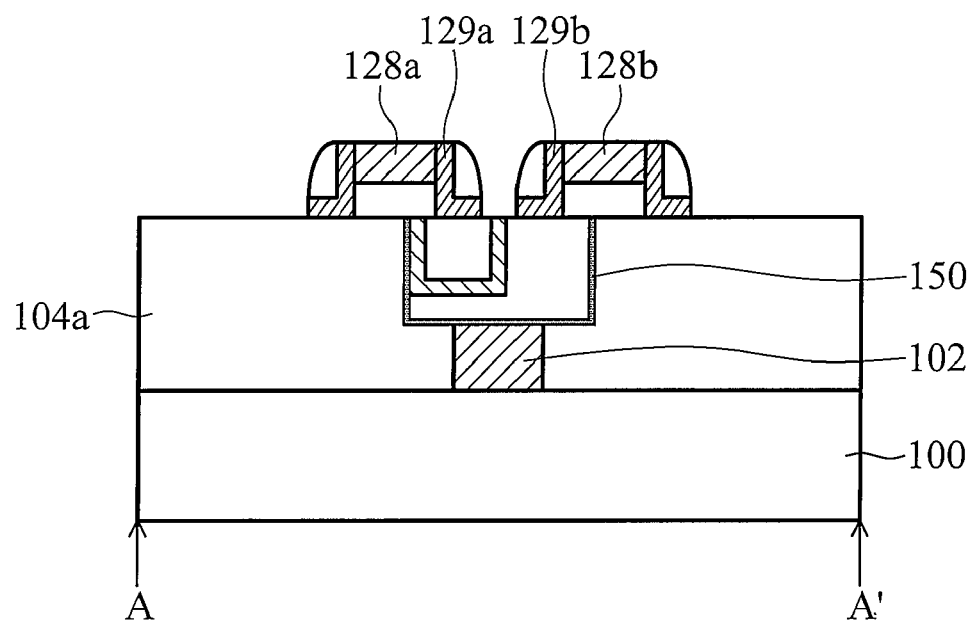
Figure 18C:
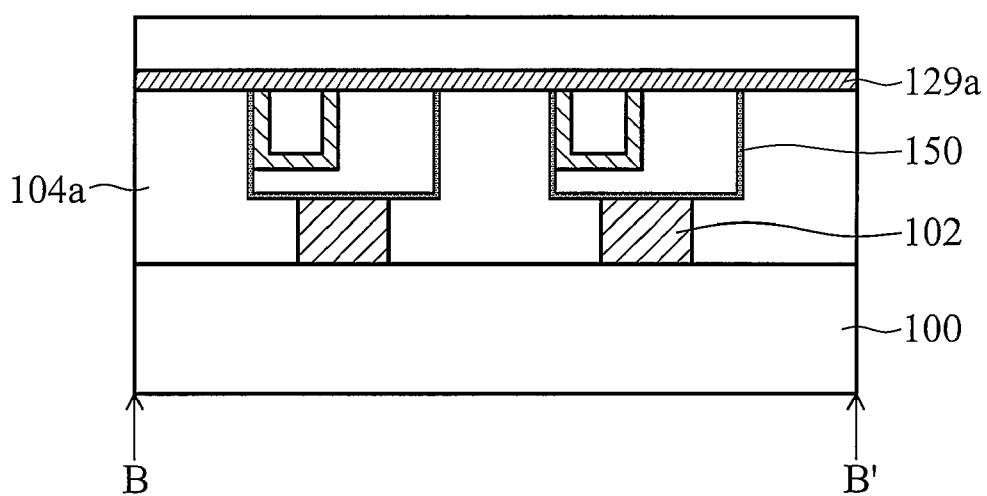

A aspect of this invention is to form top electrodes simultaneously stretched over both sides of the cup-shaped conductive structure, resulting in doubling the number of the bit of the same phase change memory element. Referring to FIG. 18a and the cross sections of FIGS. 18b and 18c thereof, the first top electrode 128a and the second top electrode 128b are parallel to each other and located to stretch over the cup-shaped conductive structure 150, wherein the first top electrode 128a and the second top electrode 128b are symmetrical. Namely, the right edge 129a of the first top electrode 128a is symmetrical to the left edge 129b of the second top electrode 128b with respect to the cup-shaped conductive structure 150. Therefore, in comparison with a phase change memory element having single top electrode, the phase change memory element having two top electrodes simultaneously stretched over the conductive structure can double the number of the bit, and be suitable for combination with another multi-bit phase change memory element as disclosed in the invention. Moreover, the aforementioned multi-bit phase change memory elements can be applied to three dimensional (3D) phase change memory fabricating processes, resulting in memory devices with superior integration.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase change memory element, comprising:
   a bottom electrode;
   a cup-shaped conductive structure having a bottom portion, a first sidewall portion, and a second sidewall portion, wherein the bottom portion of the conductive structure is electrically contacted to the bottom electrode;
   a phase change spacer comprising alternately a doped area and a non-doped area, wherein the doped area directly contacts to the non-doped area, wherein the doped area of the phase change spacer intersects the first sidewall portion, and the non-doped area of the phase change spacer intersects the second sidewall portion, and the first sidewall portion is opposite to the second sidewall portion; and
   a top electrode electrically contacted to a sidewall of the phase change spacer.

2. The phase change memory element as claimed in claim 1, wherein the opposite sidewalls of the conductive structure contacting to the phase change spacer are parallel.

3. The phase change memory element as claimed in claim 1, wherein the phase change spacer comprises a binary chalcogenide, ternary chalcogenide, quaternary chalcogenide, or non-chalcogenide phase change material.

4. The phase change memory element as claimed in claim 1, wherein the phase change spacer comprises GaSb, GeTe, Ge—Sb—Te, Ag—In—Sb—Te or combinations thereof.

5. The phase change memory element as claimed in claim 1, wherein the material of the conductive structure comprises Ru, Ir, Rh, Al, Co, W, Mo, Ti, Ta, Au, alloys thereof, laminations thereof, conductive nitrides thereof, conductive oxides thereof, or combinations thereof.

6. The phase change memory element as claimed in claim 1, wherein the doped area of the phase change spacer comprises nitride-doped area.

7. The phase change memory element as claimed in claim 1, wherein the doped area of the phase change spacer comprises oxygen-doped area.

8. The phase change memory element as claimed in claim 1, wherein the doped area of the phase change spacer comprises fluorine-doped area.

9. The phase change memory element as claimed in claim 1, wherein the top electrode and bottom electrode comprise Ru, Ir, Rh, Al, Co, W, Mo, Ti, Ta, Au, alloys thereof, laminations thereof, conductive nitrides thereof, conductive oxides thereof, or combinations thereof.

10. The phase change memory element as claimed in claim 1, further comprising an isolation spacer formed above the phase change spacer.

* * * * *